（12）United States Patent
Yoon et al.

(10) Patent No.: US 9,318,675 B2
(45) Date of Patent: Apr. 19, 2016

(54) LIGHT EMITTING DEVICE AND LIGHTING SYSTEM HAVING THE SAME

(71) Applicant: LG INNOTEK CO., LTD., Seoul (KR)

(72) Inventors: Yeo Chan Yoon, Seoul (KR); Jae Hwan Jung, Seoul (KR); Yun Shick Eom, Seoul (KR); Ki Rok Hur, Seoul (KR); Jin Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 11 days.

(21) Appl. No.: 13/836,574

(22) Filed: Mar. 15, 2013

(65) Prior Publication Data

US 2014/0070259 A1   Mar. 13, 2014

(30) Foreign Application Priority Data

Sep. 13, 2012  (KR) .................. 10-2012-0101821

(51) Int. Cl.
*H01L 33/62* (2010.01)
*H01L 33/48* (2010.01)
*H01L 25/16* (2006.01)

(52) U.S. Cl.
CPC .............. *H01L 33/62* (2013.01); *H01L 33/486* (2013.01); *H01L 25/167* (2013.01); *H01L 2224/45139* (2013.01); *H01L 2224/48091* (2013.01); *H01L 2224/48247* (2013.01); *H01L 2224/48465* (2013.01); *H01L 2224/49113* (2013.01); *H01L 2924/1301* (2013.01)

(58) Field of Classification Search
CPC ..... H01L 33/486; H01L 33/62; H01L 25/167; H01L 2924/00; H01L 33/60; H01L 33/58; H01L 33/647
See application file for complete search history.

(56) References Cited

U.S. PATENT DOCUMENTS

| D632,659 | S | * | 2/2011 | Hsieh ........................... D13/180 |
| 2006/0043401 | A1 | * | 3/2006 | Lee et al. ......................... 257/99 |
| 2010/0163920 | A1 | * | 7/2010 | Itai ................................ 257/99 |
| 2011/0198658 | A1 | * | 8/2011 | An ................................ 257/99 |
| 2012/0161180 | A1 | | 6/2012 | Komatsu et al. ............... 257/98 |
| 2012/0273826 | A1 | * | 11/2012 | Yamamoto et al. ............ 257/99 |

FOREIGN PATENT DOCUMENTS

| EP | 2 287 931 A2 | 2/2011 |
| JP | 2007-142290 A | 6/2007 |
| WO | WO 03/019677 A2 | 3/2003 |

OTHER PUBLICATIONS

European Search Report dated Sep. 30, 2014 issued in Application No. 13178406.8.

* cited by examiner

*Primary Examiner* — David Vu
*Assistant Examiner* — Mouloucoulaye Inoussa
(74) *Attorney, Agent, or Firm* — Ked & Associates, LLP

(57) ABSTRACT

Disclosed are a light emitting device and a lighting system having the same. The light emitting device includes a body including first and second lateral side parts, third and fourth lateral side parts, and a cavity, a first lead frame extending in a direction of the first lateral side part of the body, a second lead frame extending in a direction of the second lateral side part of the body, a gap part between the first and second lead frames, and a molding member in the cavity. The first lead frame includes a first recess part having a first depth, and a second recess part recessed at a second depth in a region adjacent to the first lateral side part of the body, and the first depth of the first recess part is different from the second depth of the second recess part.

16 Claims, 18 Drawing Sheets

LIGHT EMITTING DEVICE AND LIGHTING SYSTEM HAVING THE SAME

The present application claims priority under 35 U.S.C. §119(a) of Korean Patent Application No. 10-2012-0101821 filed on Sep. 13, 2012, which is hereby incorporated by reference in its entirety.

BACKGROUND

The embodiment relates to a light emitting device and a lighting system having the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a phosphor.

In addition, the LED generates the light by using the potential gap of the semiconductor device, so the LED is advantageous as compared with conventional light sources in terms of life span, response characteristics and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light emitting device having a novel lead frame structure.

The embodiment provides a light emitting device which includes a light emitting chip having a large size and can enhance the coupling the lower portion of a body and lead frame due to the step structures of the lead frame.

The embodiment provides a light emitting device capable of maximizing the lower portion area of the gap part between the first and second lead frames.

The embodiment provides a light emitting device including at least one lead frame recessed in directions opposite to each other from both lateral sides and having recessed depths different from each other.

The embodiment provides a light emitting device including a first lead frame having different recess depths and a light emitting chip provided on the first lead frame.

The embodiment provides a light emitting device in which the depth of a first recess part recessed from the gap part between first and second lead frames in the direction of the first lead frame is two times deeper than the depth of a second recess part recessed toward in another side direction of the first lead frame.

The embodiment provides a light emitting device in which the width of the first recess part of the first lead frame is equal to the width of the first lead frame.

The embodiment provides a light emitting device having a novel cavity structure.

The embodiment provides a light emitting device in which the width of the first inner surface of the cavity is different from the width of the second inner surface corresponding to the first inner surface.

The embodiment provides a light emitting device including a cavity having inner surfaces, internal angles of which are obtuse angles.

The embodiment provides a light emitting device in which the light emitting chip is closer to the first inner surface having a width wider than that of the second inner surface of the cavity.

The embodiment provides a light emitting device having the light emitting chip in the cavity and a protective chip provided in the body.

The embodiment provides a light emitting device having two pairs of inner surfaces corresponding to each other and a pair of inner surfaces that do not correspond to each other in the cavity.

According to the embodiment, there is provided a light emitting device including a body including first and second lateral side parts corresponding to each other, third and fourth lateral side parts corresponding to each other, and a cavity having an open upper portion, a first lead frame disposed on a bottom surface of the cavity while extending in a direction of the first lateral side part of the body, a second lead frame disposed on the bottom surface of the cavity while extending in a direction of the second lateral side part of the body, a gap part disposed between the first and second lead frames, and a molding member in the cavity. The first lead frame includes a first recess part recessed at a first depth in the direction of the first lateral side part of the body from the gap part, and a second recess part recessed at a second depth in a region adjacent to the first lateral side part of the body, and the first depth of the first recess part is different from the second depth of the second recess part.

According to the embodiment, there is provided a light emitting device including a body including first and second lateral side parts corresponding to each other, third and fourth lateral side parts corresponding to each other, and a cavity having an open upper portion, a first lead frame disposed on a bottom surface of the cavity while extending in a direction of the first lateral side part of the body, a second lead frame disposed on the bottom surface of the cavity while extending in a direction of the second lateral side part of the body, a gap part disposed between the first and second lead frames, and a molding member in the cavity. The first lead frame includes a first recess part recessed at a first depth in the direction of the first lateral side part of the body from the gap part, and a second recess part recessed at a second depth in a region adjacent to the first lateral side part of the body, and the first depth of the first recess part is different from the second depth of the second recess part. The cavity includes a first inner surface adjacent to the light emitting chip and a second inner surface which is spaced apart from the light emitting chip by an interval greater than an interval between the first inner surface and the light emitting chip and disposed in opposition to the first inner surface, and the second inner surface has a width narrower than a width of the first inner surface and a width of at least one lateral side of the light emitting chip.

According to the embodiment, there is provided a light emitting device including a body including first and second lateral side parts corresponding to each other, third and fourth lateral side parts corresponding to each other, and a cavity having an open upper portion, a first lead frame disposed on a bottom surface of the cavity while extending in a direction of the first lateral side part of the body, a second lead frame disposed on the bottom surface of the cavity while extending in a direction of the second lateral side part of the body, a gap part disposed between the first and second lead frames, and a molding member in the cavity. The cavity includes a first inner surface adjacent to the light emitting chip and a second inner surface which is spaced apart from the light emitting chip by an interval greater than an interval between the first inner surface and the light emitting chip and disposed corresponding to the first inner surface, and the first inner surface of the cavity has a width different from a width of the second inner surface of the cavity.

DETAILED DESCRIPTION OF THE EMBODIMENTS

Figure 1:
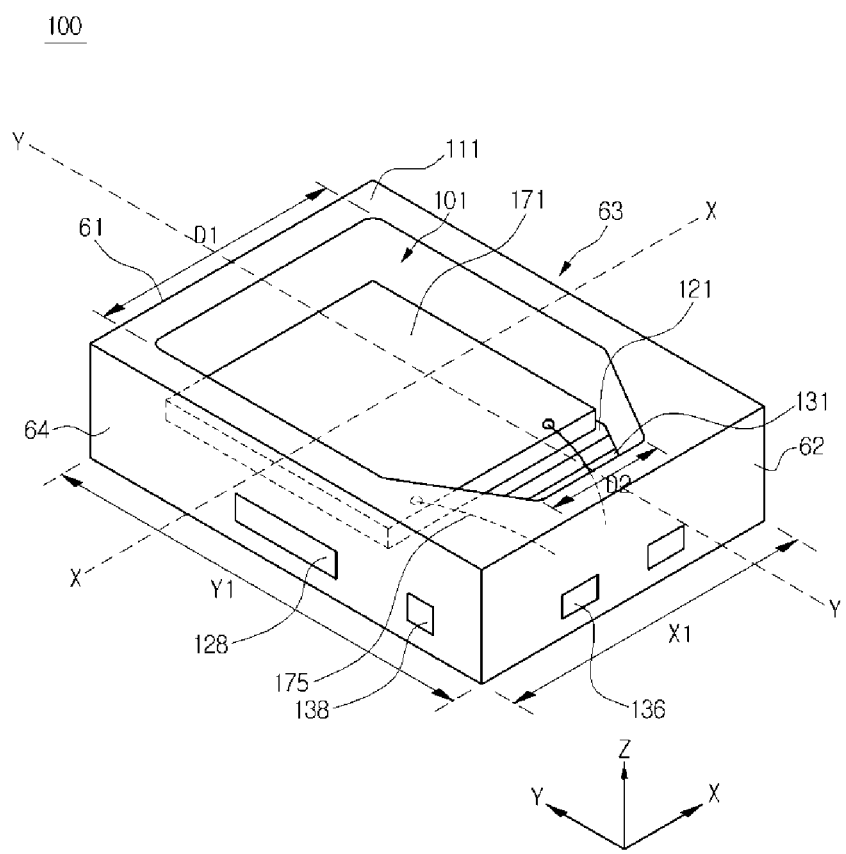
FIG. 1 is a perspective view showing a light emitting device according to a first embodiment.

In the following description, when a predetermined part "includes" a predetermined component, the predetermined part does not exclude other components, but may further include other components unless otherwise indicated. In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present.

Hereinafter, embodiments will be clearly comprehended by those skilled in the art with reference to accompanying drawings and the description of the embodiments. The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

Hereinafter, a light emitting device according to the embodiment will be described with reference to accompanying drawings.

Figure 2:
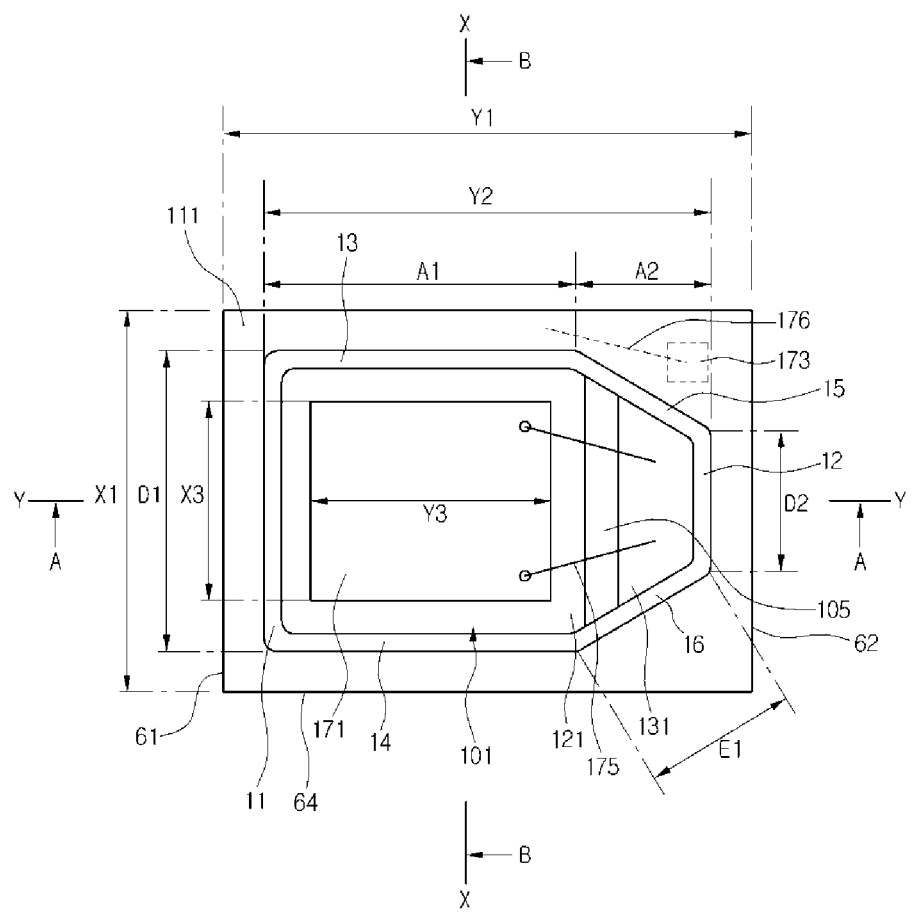
FIG. 2 is a plan view showing the light emitting device of FIG. 1.
Figure 3:
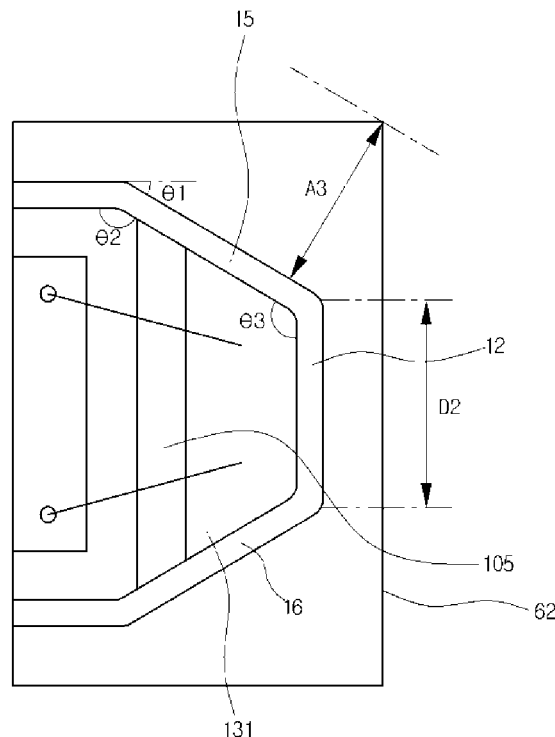
FIG. 3 is an enlarged view showing a portion of the light emitting device of FIG. 1.
Figure 4:
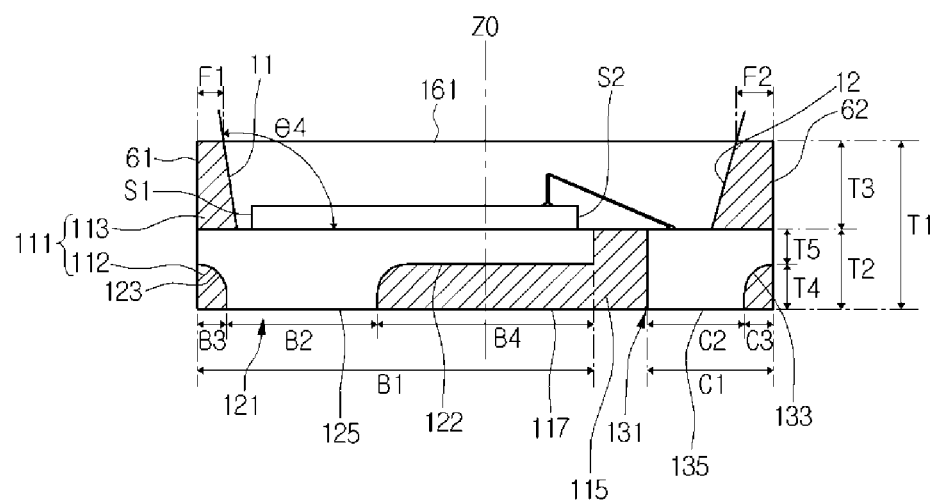
FIG. 4 is a sectional view taken along line Y-Y of the light emitting device of FIG. 2
Figure 5:
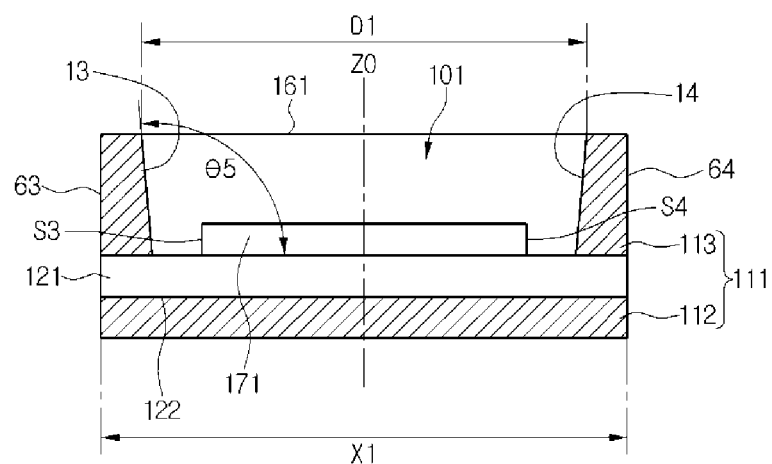
FIG. 5 is a sectional view taken along line X-X of the light emitting device of FIG. 2.
Figure 6:
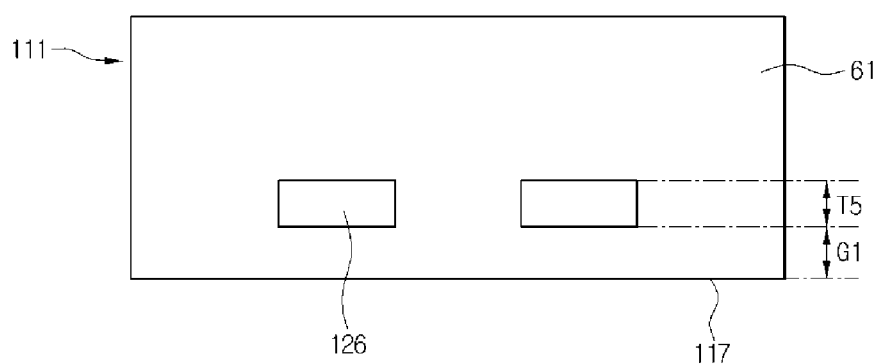
FIGS. 6 to 9 are sectional views showing a lateral side of the body of the light emitting device of FIG. 2.
Figure 7:
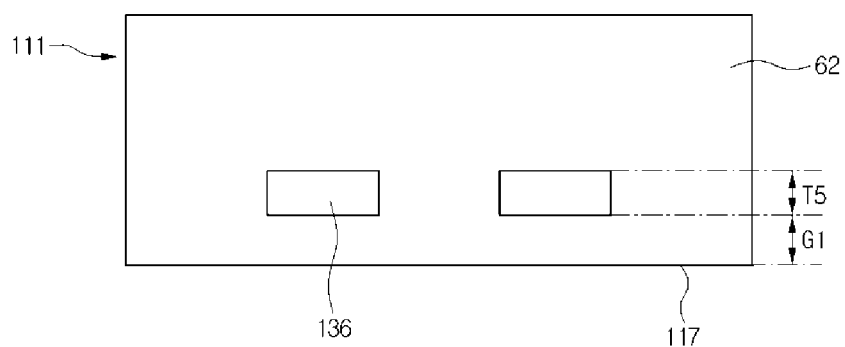
Figure 8:
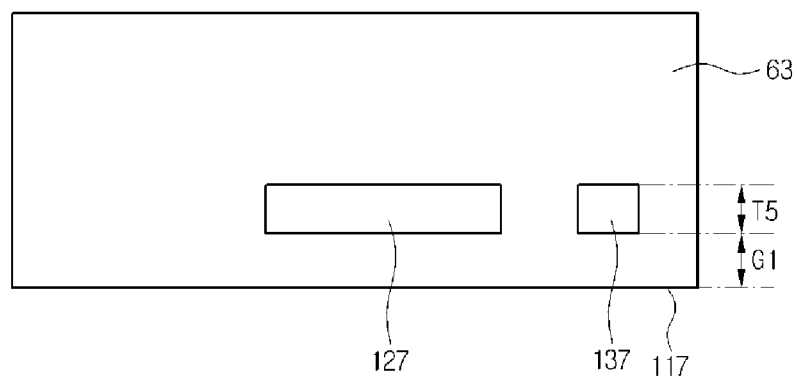
Figure 9:
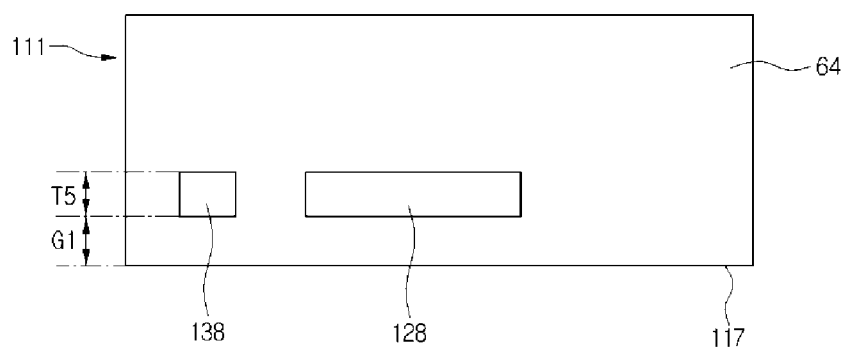
Figure 10:
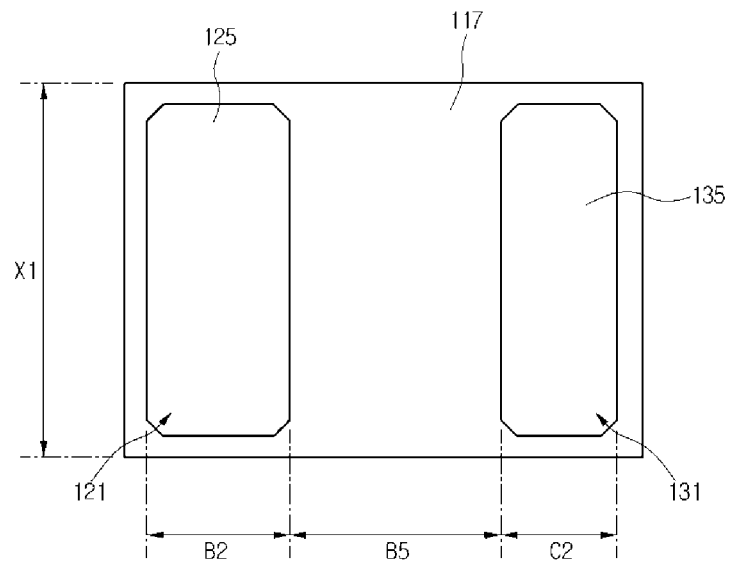
FIG. 10 is a bottom view showing the light emitting device of FIG. 2,
FIGS. 11 and 12 are a front view and a bottom view showing the lead frame of the light emitting device of FIG. 2.
Figure 11:
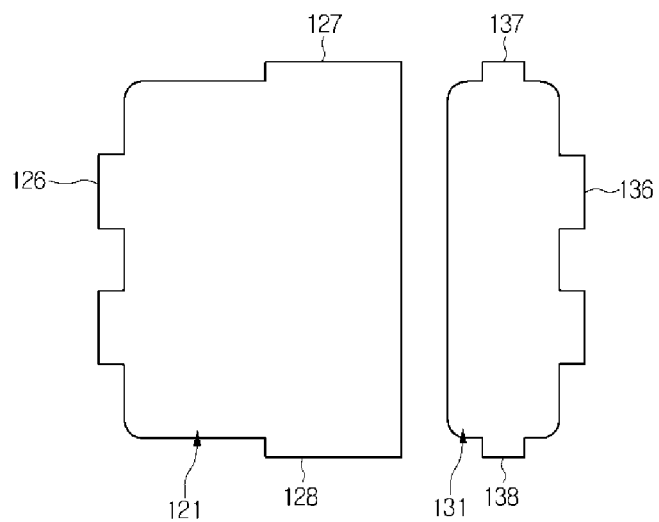
Figure 12:
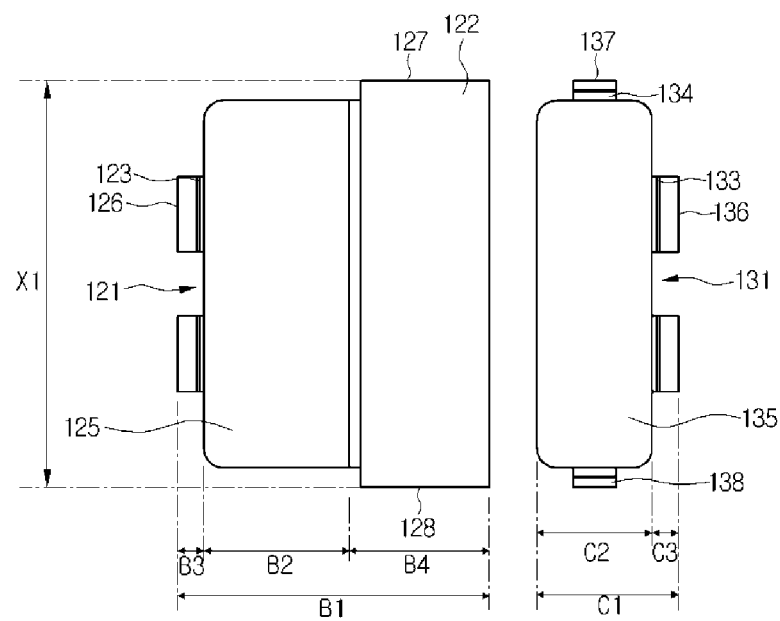

FIG. 1 is a perspective view showing a light emitting device according to a first embodiment, FIG. 2 is a plan view showing the light emitting device of FIG. 1, and FIG. 3 is an enlarged view showing a portion of the light emitting device of FIG. 2. FIG. 4 is a sectional view taken along line Y-Y of the light emitting device of FIG. 1, FIG. 5 is a sectional view taken along line X-X of the light emitting device of FIG. 1, and FIGS. 6 to 9 are sectional views showing a lateral side of the body of the light emitting device of FIG. 2. FIG. 10 is a bottom view showing the light emitting device of FIG. 2, and FIGS. 11 and 12 are a front view and a bottom view showing a lead frame of the light emitting device of FIG. 2.

Referring to FIGS. 1 to 5, a light emitting device 100 includes a body 111 having a cavity 101, a plurality of lead frames 121 and 131, a light emitting chip 171, a wire 175, and a molding member 161.

The body 111 may include an insulating material or a conductive material. The body 111 may include at least one of a resin material such as polyphthalamide (PPA) or polycyclohexylene terephthalate (PCT), silicon (Si), a metallic material, photo sensitive glass (PSG), sapphire ($Al_2O_3$), and a printed circuit board (PCB). For example, the body 111 may be injection-molded through an injection scheme. The body 111 may include a resin material such as epoxy or silicon.

The body 111 includes an epoxy molding compound (EMC) material having epoxy, and the EMC material represents improved formability, improved moisture resistance, and an improved adhesive property, and includes an insulating material. The body 111 may have a filler, which includes a metallic oxide such as $TiO_2$, $SiO_2$, in order to enhance a reflection efficiency. The filler having the contents of 10 wt % or more, for example, 15 wt % or more may be contained in the body 111.

The body 111 may include a reflective material for light reflection, or may include a transmissive material to broad the distribution of light orientation angles, but the embodiment is not limited thereto.

The outer shape of the body 111 may have a polygonal structure such as a rectangular shape or a square shape when viewed from the top. The outer corners of the body 111 may be angulated or curved.

In the light emitting device 100, if the body 111 has the square shape, the body 111 may include a plurality of lateral side parts, for example, four lateral side parts 61 to 64. At least one of the lateral side parts 61 to 64 may be perpendicular to the bottom surface of the body 111 or may be inclined with respect to the bottom surface of the body 111. Hereinafter, the body 111 having the first to fourth lateral side parts 61 to 64 will be described for the illustrative purpose. The first lateral side part 61 and the second lateral side part 62 are opposite to each other. The second lateral side part 63 and the fourth lateral side part 64 are opposite to each other. An axis passing through the center of the first and second lateral side parts 61 and 62 of the body 111 is defined as a first axis Y-Y, and an axis passing through the third and fourth lateral side parts 63 and 64 of the body 111 is defined as a second axis X-X. The first axis Y-Y may be perpendicular to the second axis X-X. The first axis Y-Y of the light emitting device 100 represents a lengthwise direction of the body 111, and the second axis X-X may represent a widthwise direction.

In the body 111, a length Y1 of the third lateral side part 63 or the fourth lateral side part 64 may be equal to or longer than a width X1 of the first lateral side part 61 or the second lateral side part 62. If the length Y1 of the third lateral side part 63 or the fourth lateral side part 64 is longer than the width X1 of the first lateral side part 61 or the second lateral side part 62, the length Y1 of the third lateral side part 63 or the fourth lateral side part 64 may be 1.2 times longer than the width X1 of the first lateral side part 61 or the second lateral side part 62.

The body 111 includes the cavity 101 having an open upper portion and a predetermined depth, and the cavity 101 may have a cup structure or a recess structure having a depth lower than that of the top surface of the body 111. The lead frames 121 and 131 and a gap part 115 may be disposed on a bottom surface of the cavity 101, and the gap part 115 may be interposed between the lead frames 121 and 131.

The cavity 101 may include a plurality of inner surfaces 11 to 16. The cavity 101 may have more than four inner surfaces 11 to 16, for example, five or six inner surfaces. Hereinafter, an example that the cavity 101 according to the embodiment has six inner surfaces 11 to 16 will be described. At least one of the first to six inner surfaces 11 to 16 may have a curved surface or may be connected to a curved surface in a predetermined section.

At least one of the inner surfaces 11 to 16 is inclined outward with respect to a thickness direction Z0 or an optical axis of the light emitting chip 171. For example, the at least one of the inner surfaces 11 to 16 may be inclined with respect to the top surface of the lead frames 121 and 131 or the horizontal bottom surface of the cavity 101. Although the embodiment has been described in that the inner surfaces 11 to 16 of the cavity 101 are inclined, but the embodiment is not limited. For example, at least one of the inner surfaces 11 to 16 of the cavity 101 may be perpendicular to the top surface of the lead frames 121 and 131 or the horizontal bottom surface of the cavity 101, but the embodiment is not limited thereto.

Referring to FIGS. 2 and 3, the sum of the internal angles of the inner surfaces 11 to 16 is 400° or more. In addition, in two adjacent inner surfaces, boundary regions where the internal angle is formed as an obtuse angle may be two or more of boundary regions, for example, four of boundary regions.

The inner surfaces 11 to 16 of the cavity 101 may be defined as first to sixth inner surfaces 11 to 16. The first inner surface 11 corresponds to a first lateral side part 61 of the body 111, and the second inner surface 12 corresponds to the second lateral side part 62 of the body 111. The third inner surface 13 corresponds to the third lateral side part 63 of the body 111, and the fourth inner surface 14 corresponds to the fourth lateral side part 64 of the body 111. The fifth inner surface 15 is connected between the third and second inner surfaces 13 and 12, and forms an obtuse angle together with at least one of the third and second inner surfaces 13 and 12. The sixth inner surface 16 is connected between the fourth inner surface 14 and the second inner surface 12, and forms an obtuse angle together with at least one of the fourth and second inner surfaces 14 and 12.

The first to fourth inner surfaces 11 to 14 may correspond to the inner surfaces of the light emitting chip 171.

The internal angle θ2 between the fifth and third inner surfaces 15 and 13 may be formed as an obtuse angle, for example, an angle of 130° to 170°. In addition, the internal angle between the sixth and fourth inner surfaces 16 and 14 may be formed within the range of the angle θ2, or may be equal to the angle θ2.

The internal angle θ3 between the fifth and second inner surfaces 15 and 12 may be formed as an obtuse angle, for example, an angle of 140° to 165°. In addition, the internal angle between the sixth and second inner surfaces 16 and 12 may be formed within the range of the angle θ3, or may be equal to the angle θ3. In addition, the fifth inner surface 15 may be formed at an angle θ1 less than 90°, for example, an angle of 10° to 50° about a line segment extending from the third inner surface 13.

In addition, the first and second inner surfaces 11 and 12 are parallel to each other, and the third and fourth inner surfaces 13 and 14 are parallel to each other. The sixth and second inner surfaces 16 and 12 are formed perpendicularly to each other. The fifth and sixth inner surfaces 15 and 16 are obliquely formed with respect to the first to fourth inner surfaces 11 to 14 in such a manner that the fifth and sixth inner surfaces 15 and 16 are not parallel to the first to fourth inner surfaces 11 to 14. The corners of the first to sixth inner surfaces 11 to 16 may be curved or angulated, but the embodiment is not limited thereto.

A second width D2 of the second inner surface 12 of the cavity 101 may be narrower than a first width D1 of the first inner surface 11. The second width D2 may be at least 1.5 times narrower than the first width D1, for example, may be 2.5 times to 3.5 times narrower than the first width D1. The second width D2 may be less than a width X3 of the light emitting chip 171, and may be 1/3.5 times less than a width X1 of the body 111. The first width D1 may be 1.2 times greater than the width X3 of the light emitting chip 171. The second width D2 may be in the range of 0.42 mm±0.05 mm, and may be changed according to the sizes of the light emitting chip 171. The first and second widths D1 and D2 may be lengths of the boundary regions in which the first and second inner surfaces 11 and 12 make contact with the top surface of the body 111.

The second width D2 is at least 1.5 times narrower than the first width D1, for example, 2.5 times to 3.5 times narrower than the first width D1, in such a manner that a cavity structure representing an asymmetric structure with respect to one axial direction is provided. A protective chip 173 is disposed in the body 111, thereby more preventing the light loss as compared with that of the structure in which the protective chip 173 is disposed in the cavity 101.

The difference between the second and first widths D2 and D1 may be made by taking the size of the protective chip 173 and a bonding region of the wire 175 of the second lead frame 131. For example, if one wire 175 is provided, the difference between the second and first widths D2 and D1 may be more increased, but the embodiment is not limited thereto.

In addition, the cavity having a symmetric structure with respect to another axial direction is provided, so that the degradation of the light extraction efficiency can be prevented. The second width D2 of the second inner surface 12 of the cavity 101 is formed narrower than the first width D1 of the first inner surface 11, so that the cavity having five or more inner surfaces is provided instead of the cavity having four inner surfaces. Accordingly, the light loss can be minimized.

The center of the first inner surface 11 is aligned in line with the center of the second inner surface 12 in the cavity 101. For example, the centers of the first and second inner surfaces 11 and 12 may be aligned in line with the first axis Y-Y. Alternatively, one of the centers of the first and second inner surfaces 11 and 12 in the cavity 101 may deviate from the first axis Y-Y, but the embodiment is not limited thereto.

The maximum interval between the fifth and sixth inner surfaces 15 and 16 in the cavity 101 is the interval D1 between the third and fourth inner surfaces 13 and 14, and the minimum interval between the fifth and sixth inner surfaces 15 and 16 may be equal to the width D2 of the second inner surface 12.

A width E1 of the fifth or sixth inner surface 15 or 16 may be less than the width D1 of the first inner surface 11, and wider than the width D2 of the second inner surface 12. The width D1 of the first inner surface 11 may be equal to or different from the width A1 of the third or fourth inner surface 13 or 14, but the embodiment is not limited thereto. In this case, a distance A2 may be the interval between a line horizontal to the second inner surface 12 and the inflection point between the third and fifth inner surfaces 13 and 15, or the inflection point between the fourth and sixth inner surfaces 14 and 16, and may be shorter than the width A1.

The width of a region corresponding to the space between the second lateral side part 62 of the body 111 and the second inner surface 12 may be narrower than the width of a region corresponding to the space between the second lateral side part 62 and the first inner surface 11.

The length Y2 of the cavity 101 in the first axial direction Y-Y may be greater than the width D1 in a second axial direction X-X. In detail, the length Y2 may be 1.2 or more times, for example, 1.4 times longer than the width D1. The cavity 101 has a substantially line-symmetric structure with respect to the first axial direction Y-Y, and has an asymmetric structure with respect to the second axial direction X-X.

In addition, a portion of the top surface of the first lead frame 121 exposed to the bottom surface of the cavity 101 may has a square shape or a rectangular shape. A portion of the top surface of the second lead frame 131 exposed to the bottom surface of the cavity 101 may have a trapezoid shape. For example, regarding the width of the top surface of the second lead frame 131 exposed to the bottom surface of the cavity 101, a region adjacent to the second inner surface 12 of the cavity 101 may have a width narrower than that of a region corresponding to the first lead frame 121.

As shown in FIG. 4, the angle θ4 of the first inner surface 11 or the second inner surface 12 of the cavity 101 may be formed as an angle of 90° or more, for example, an angle of 91° to 120° about the top surface of the lead frame 121 or 131 or the bottom surface of the cavity 101. The first inner surface 11 or the second inner surface 12 may have the same angle or different angles, but the embodiment is not limited thereto.

As shown in FIG. 5, the angle θ5 of the third inner surface 13 or the fourth inner surface 14 of the cavity 101 may be formed as an angle of 90° or more, for example, an angle of 91° to 120° about the top surface of the lead frames 121 and 131 or the bottom surface of the cavity 101. The third inner surface 13 or the fourth inner surface 14 may have the same angle or different angles, but the embodiment is not limited thereto.

The first to fourth inner surfaces 11, 12, 13, and 14 may be inclined at the same angle with respect to the top surfaces of the lead frames 121 and 131, or the bottom surface of the cavity 101. For example, the angles θ4 and θ5 may be formed in the range of 91° to 97°. In addition, the fifth and sixth inner surfaces 15 and 16 of the cavity 101 may be inclined at an angle of 90° to 120° with respect to the top surface of the lead frames 121 and 131 or the horizontal bottom surface of the cavity 101. For example, the fifth and sixth inner surfaces 15 and 16 of the cavity 101 may be inclined at the same angle as that of the first to fourth inner surfaces 11 to 14.

The first inner surface 11 of the cavity 101 is adjacent to a first lateral side S1 of the light emitting chip 171, and the second inner surface 12 is spaced apart from a second lateral side S2 of the light emitting chip 171. The third inner surface 13 is adjacent to a third lateral side S3 of the light emitting chip 171, and the fourth inner surface 14 is adjacent to the fourth lateral side S4 of the light emitting chip 171. In this case, the light emitting chip 171 may have a polygonal shape or a curved shape, but the embodiment is not limited thereto. The light emitting chip 171 is provided in such a manner that the interval from the second inner surface 121 among the first to fourth inner surfaces 11 to 14 of the cavity 101 corresponding to the lateral sides S1 to S4 is two times greater than the intervals from the first to third inner surfaces 11 to 13.

As shown in FIGS. 4 and 5, the body 111 includes a support body 112 disposed under the top surface of the lead frames 121 and 131, a reflection body 113 disposed on the top surface of the lead frames 121 and 131, and a gap part 115 interposed between the first and second lead frames 121 and 131. The support body 112, the reflection body 113, and the gap part 115 may be connected to each other. The reflection body 113 may have a thickness thicker than that of the support body 112. For example, the reflection body 113 may have a thickness of 150 μm or more. The reflection body 113 may have a thickness T3 corresponding to 50% or more of the thickness T1 of the body 111.

The interval F1 between the first lateral side part 61 of the top surface of the body 111 and the first inner surface 11 of the cavity 101 may be narrower than the interval F2 between the second lateral side part 62 of the top surface of the body 111 and the second inner surface 12 of the cavity 101. The interval F2 is wider than the interval F1, so that the second lead frame 131 may be supported. The thickness T2 of the lead frames 121 and 131 may be equal to the thickness of the support body 112.

Referring to FIG. 2, and FIGS. 6 to 13, in the structure of the lead frames, the inner region of the first lead frame 121 is disposed at the bottom surface of the cavity 101, and the outer region of the first lead frame 121 extends to lower portions of the first, third, fourth inner surfaces 11, 13, and 14 of the cavity 101. As shown in FIGS. 4 and 5, the first lead frame 121 includes at least one first protrusion 126 exposed to the first lateral side part 61 of the body 111, a second protrusion 127 exposed to the third lateral side part 63, and the third protrusion 128 exposed to the fourth lateral side part 64. The first to third protrusions 126 to 128 are spaced apart from the bottom surface 117 of the body 111 by a predetermined interval G1.

The interval G1 may be 10 µm or more, or ½ or less of the thickness T2 of the first lead frame 121.

The inner region of the second lead frame 131 is disposed at the bottom surface of the cavity 101, and the outer region of the second lead frame 131 extends to the lower portions of the second, fifth, and sixth inner surfaces 12, 15, and 16. The second lead frame 131 includes at least one fourth protrusion 136 exposed to the second lateral side part 62 of the body 111, a fifth protrusion 137 exposed to the third lateral side part 63, and a sixth protrusion 138 exposed to the fourth lateral side part 64.

Referring to FIGS. 11 and 12, the first protrusion 126 of the first lead frame 121 and the fourth protrusion 136 of the second lead frame 131 may protrude in the plural. The second and third protrusions 127 and 128 of the first lead frame 121 protrude in opposition to each other, and the fifth and sixth protrusions 137 and 138 of the second lead frame 131 protrude in opposition to each other. The corner part of the first and second lead frames 121 and 131 may be angulated or curved.

As shown in FIGS. 6 to 9, the fourth to sixth protrusions 136, 137, and 138 are spaced apart from the bottom surface 117 of the body 111 by a predetermined interval G1. The interval G1 may be 10 µm or more, or which may be 50% or less of the thickness T2 of the second lead frame 131.

As shown in FIGS. 4, 5, and 10, the first and second lead frames 121 and 131 include lead regions making contact with the top surface of the printed circuit board PCB. A first lead region 125 of the first lead frame 121 is exposed to the bottom surface 117 of the body 111, and disposed between the first and second recess parts 122 and 123. The second lead region 135 of the second lead frame 131 is exposed to the bottom surface 137 of the body 111, and disposed between the gap part 115 and the third recess part 133.

The interval B5 between the first and second lead regions 125 and 135 is wider than the interval between the first and second lead frames 121 and 131 of the bottom surface of the cavity 101. The length B2 of the first lead region 125 may be longer than the length C2 of the second lead region 135, but the embodiment is not limited thereto. The length B2 of the first lead region 125 may be in the range of 0.5 mm±0.1 mm, and the length C2 of the second lead region 135 may be in the range of 0.4 mm±0.05 mm. Since the area of the first lead region 125 is wider than the area of the second lead region 135, heat radiations can be effectively occur.

In addition, the interval B5 between the first and second lead regions 125 and 135 is made by taking the interval between circuit patterns of the substrate into consideration, so that a general-purpose light emitting device can be provided. Accordingly, the area of the bottom surface of the first lead frame 121 is narrower than the area of the top surface of the first lead frame 121. In detail, the area of the bottom surface of the first lead frame 121 is narrower than the area of the top surface of the first lead frame 121 by 30% or more. The length B1 of the top surface of the first lead frame 121 may be wider than the length C1 of the top surface of the second lead frame 131. In detail, the length B1 of the top surface of the first lead frame 121 may be wider than the length C1 of the top surface of the second lead frame 131 by 30% or more. The difference in the length between the top surfaces of the first and second lead frames 121 and 131 can improve heat radiation efficiency of the light emitting chip 171.

The first and second lead frames 121 and 131 are disposed at the lower portions thereof with a plurality of recess parts making contact with or coupled with the support body 112 of the body 111. The recess parts may be defined as recess regions.

For example, the first lead frame 121 includes first and second recess parts 122 and 123. The first recess part 122 is interposed between the first lead region 125 of the first lead frame 121 and the gap part 115, and disposed therein with the support body 112 as shown in FIG. 5. The first recess part 122 has a width equal to the width X1 of the body 111 or the length of the first lateral side part 61, and has a depth B4 which is two times wider than the depth B3 of the second recess part 123. The first recess part 122 is disposed in a step structure under the inner region of the first lead frame 121, so that the first recess part 122 is coupled with the support body 112 of the body 111.

The depth B4 of the first recess part 122 has the range of 30% to 60% of the length B1 of the first lead frame 121, and forms a step structure with respect to the flat surface of the first lead region 125. The height of the first recess part 122 is an interval from the bottom surface 117 of the body 111, and may be 50% or less of the thickness T2 of the first lead frame 121. If the interval G1 is excessively thick, the protrusions of the first lead frame 121 may be excessively thinned, so that heat radiation efficiency can be degraded, the strength can be weakened, and the coupling strength with the body 112 may be degraded. In addition, if the interval G1 is excessively thinned, the support body at the lower portion of the body 112 may be degraded. In addition, the depth B4 and the width of the first recess part 122 may increase the area of the lower portion of the gap part 115. The area of the lower portion of the gap part 115 is increased by at last two times as compared with the structure without the recess, so that the area between the first and second lead frames 121 and 131 can be enhanced. In addition, the infiltration path of the moisture into the first lead frame 121 having the light emitting chip 171 mounted thereon can be increased by two times or more.

In addition, if the light emitting chip 171 is enlarged, the size of the first lead frame 121 having the light emitting chip 171 mounted thereon is increased in proportion to the size of the light emitting chip 171. In addition, if the top surface of the first lead frame 121 exposed to the cavity 101 is increased, the strength of the region between the first and second lead frames 121 and 131 may be more weakened. Therefore, the width of the gap part 115 is increased without decreasing the area of the top surface of the first lead frame 121. In other words, the area of the gap part 115 is ensured by forming the first recess part 121 at the lower portion of the first lead frame 121, so that strength can be enhanced between the first and second lead frames 121 and 131.

The first recess part 122 of the first lead frame 121 is recessed at a predetermined depth B4 from the gap part 115 to the first lateral side part 11 of the body 111. In the first recess part 122, the thickness T5 of the upper portion of the first lead frame 121 may be in the range of 30% to 70%, for example, 50% or more of the thickness T2 of the first lead frame 121. The upper thickness T5 of the first and second lead frames 121 and 131 may be equal to the thicknesses of the second and third protrusions 128 and 138. In addition, the depth B4 of the first recess part 122 may be equal to or different from the lengths of the second protrusion 128 and the third protrusion 138.

The second recess part 123 of the first lead frame 121 is adjacent to the first lateral side part 61 of the body 111, has a step structure from the first lead region 125 under the first protrusion 126, and is coupled with the lower portion of the body 111, that is, the support body 112 of the body 111. In the second recess part 123, the thickness T5 of the upper portion of the second lead frame 131 may be in the range of 30% to 70%, for example, 50% or more of the thickness T2 of the first lead frame 121. If the interval G1 is excessively thick, the thickness of the protrusions of the second lead frame 131 is excessively thinned, so that the heat radiation efficiency can be degraded, and the strength may be weakened. Accordingly, the coupling strength with the body 112 may be degraded. If the interval G1 is excessively thinned, the support body serving as the lower portion of the body 112 may be damaged.

The second lead frame 131 includes third and fourth recess parts 133 and 134 having the step structure under the fourth to sixth protrusions 136, 137, and 138. The third recess part 133 is a step difference region from the second lead region 135 of the second lead frame 131, and is coupled with the support body 112 which is the lower portion of the body 111. The thickness T5 of the upper portion of the second lead frame 131 in the third recess part 133 may be thinner than the thickness T2 of the second lead frame 131. In detail, the thickness T5 of the upper portion of the second lead frame 31 may be thinner than the thickness T2 of the second lead frame 131. In detail, the thickness T5 of the upper portion of the second lead frame 31 may be in the range of 30% to 70%, for example, 50% or more of the thickness T2 of the second lead frame 131. The third recess part 133 is a region formed by etching the lower region of the second lead frame 131. The third recess part 133 has the height corresponding to the interval from the bottom surface 117 of the body 111, and has a thickness corresponding to 50% or less of the thickness T2 of the second lead frame 131. The fourth recess part 134 may have the step structure under the fifth and sixth protrusions 137 and 138.

The width or the area of the top surface of the second lead frame 131 may be wider than the width or the area of the bottom surface of the second lead frame 131.

The depth B3 of the second recess part 123 of the first lead frame 121 and the depth C3 of the third recess part 133 of the second lead frame 131 may be defined as depths of outer sides of the first and second lead frames 121 and 131, and may be 0.8 μm or more, for example, in the range of 0.8 μm to 30 μm. The depths B3 and C3 of the second and third recess parts 123 and 133 may be the minimum thicknesses to prevent the support body 112 of the body 111 from being damaged.

The depth B4 of the first recess part 122 in the lower region of the first lead frame 121 may be at least two times longer than the depth B3 of the second recess part 123. Accordingly, since the first recess part 122 is spaced apart from the bottom surface of the body 111, thereby increasing the infiltration path of moisture to the top surface of the first lead frame 121 having the light emitting chip 171 mounted thereon.

In addition, the bending portions of the second and third recess parts 123 and 133 may be curved with a predetermined curvature, and the curved surfaces increase the contact area of the support body 112 and increase the infiltration path of the moisture. In addition, the recess part 122 may be curved with a predetermined curvature adjacent to the first lead region 125.

The gap part 115 is disposed in the region between the first and second lead frames 121 and 131. The gap part 115 has an interval in the bottom surface of the body 111 two times wider than the width in the bottom surface of the cavity 101 (see B5 of FIG. 8).

The thicknesses T2 of the first and second lead frames 121 and 131 may be in the range of 0.15 mm to 0.8 mm, for example, in the range of about 0.25 mm to about 0.35 mm. The first and second lead frames 121 and 131 may include a metallic material, for example, at least one of titanium (Ti), copper (Cu), nickel (Ni), gold (Au), chrome (Cr), tantalum (Ta), platinum (Pt), zinc (Sn), silver (Ag), and phosphorous (P). The first and second lead frames 121 and 131 may include a single metallic layer or a multi-metallic layer. The thicknesses T2 of the first and second lead frames 121 and 131 are different from each other, but the embodiment is not limited thereto.

At least one light emitting chip 171 is disposed on the first lead frame 121. An adhesive agent (not shown) may be disposed between the light emitting chip 171 and the second lead frame 131. The light emitting chip 171 may be closer to the first inner surface 11 of the cavity 101 than the second inner surface 12 of the cavity 101. In addition, the center of the light emitting chip 171 may deviate from the central axis Z0 of the light emitting device, and may be closer to the second inner surface 12 of the cavity 101 than the first inner surface 11 of the cavity 101.

The adhesive agent may include a conductive adhesive agent or an insulating adhesive agent. According to the embodiment, the light emitting chip 171 is bonded to the first lead frame 121 by using a conductive adhesive agent, and the first lead frame 121 is electrically connected to the light emitting chip 171. The light emitting chip 1271 may be electrically connected to the second lead frame 131 through a connection member such as at least one wire 175.

The light emitting chip 171 may selectively emit light in range of the visible light band to the ultraviolet light band. For example, the light emitting chip 171 may be selected from red, blue, green, yellow-green, and white LED chips. The light emitting chip 171 includes an LED chip including at least one of compound semiconductors of the group III-V elements to compound semiconductors of group II-VI elements. One light emitting chip 171 or a plurality of light emitting chips 171 may be disposed in the cavity 101, but the embodiment is not limited thereto. The light emitting chip 171 may include a vertical chip in which electrodes for an anode and a cathode are vertically arranged, a flip chip in which the electrodes for the anode and the cathode are arranged in one direction, or a horizontal chip in which the electrodes for the anode and the cathode are horizontally arranged. The length Y3 of the light emitting chip 171 may be in the range of 0.5 mm to 1.5 mm, and the width X3 of the light emitting chip 171 may be in the range of 0.5 mm to 1.5 mm, but the embodiment is not limited thereto. The length and the width of the light emitting chip 171 may be equal to each other or different from each other. The thickness of the light emitting chip 171 may be in the range of 100 μm to 300 μm.

The protective chip 173 is disposed on the second lead frame 131, and connected with the first lead frame 121 through the connection member such as the wire 176 or a conductive pattern. The protective chip 173 is embedded in the body 111 and disposed at an outside of the cavity 101 adjacent to the fifth inner surface 15. The wire 176 connected to the protective chip 173 is disposed in the body 111, and a portion of the protective chip 173 may be exposed from the body 111, but the embodiment is not limited thereto.

As shown in FIG. 3, an interval A3 between the fifth inner surface 15 of the cavity 101 and the corner of the body 111 may be 5 mm or more, for example, in the range of 5.82 mm to 6.59 mm. The interval A3 can provide the space for the bonding of the protective chip 173.

Alternatively, the protective chip 173 may be disposed at another region. In detail, the protective chip 173 may be disposed in the body 111 outside the sixth inner surface 16. In addition, a plurality of protective chips may be adjacent to at least one of the fifth and sixth inner surfaces 15 and 16 and may be embedded in the body 111. The protective chip 173 may include a thyristor, a zener diode, or a transient voltage suppression (TVS), but the embodiment is not limited thereto.

The molding member 161 is disposed in the cavity 101. The molding member 161 covers the light emitting chip 171. The molding member 161 includes a transmissive resin layer such as silicon or epoxy, and may have a single layer structure or a multiple layer structure. In addition, the molding member 161 may include a phosphor used to convert the wavelength of the light emitted upward from the light emitting chip 171. The phosphor excites a portion of the light emitted from the light emitting chip 171 so that the light can be mitted with a different wavelength. The phosphor may selectively include YAG, TAG, silicate, nitride, and oxy-nitride-based materials. The phosphor may include at least one red, yellow, and green phosphors, but the embodiment is not limited thereto. The top surface of the molding member 161 may have a flat shape, a concave shape, or a convex shape, and may serve as a light exit surface. A lens may be disposed at the upper portion of the molding member 161. The lens may include a convex lens, a concave lens, and a convex lens having a total reflection surface at the center thereof for the light emitting chip 171, but the embodiment is not limited thereto.

Alternatively, a phosphor layer may be further disposed on the molding member 161 and the light emitting chip 171, and a molding member representing a reflective characteristic may be disposed between the inner surfaces 11 to 16 of the cavity 101 and the lateral sides of the light emitting chip 171. The reflective material has a characteristic of reflecting 70% of the wavelength emitted from the light emitting chip 171. A molding member having transmittance may be disposed on the molding member having reflectance, but the embodiment is not limited thereto.

Figure 13:
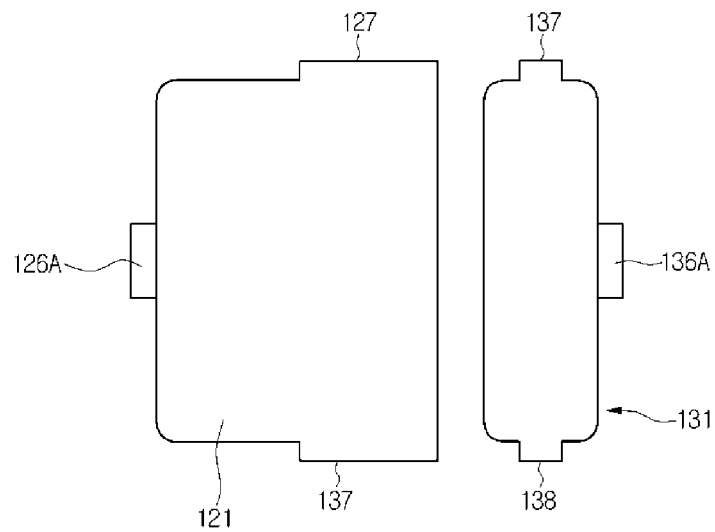
FIGS. 13 and 14 are a plan view and a bottom view showing other examples of the lead frames in the light emitting device shown in FIGS. 11 and 12.
Figure 14:
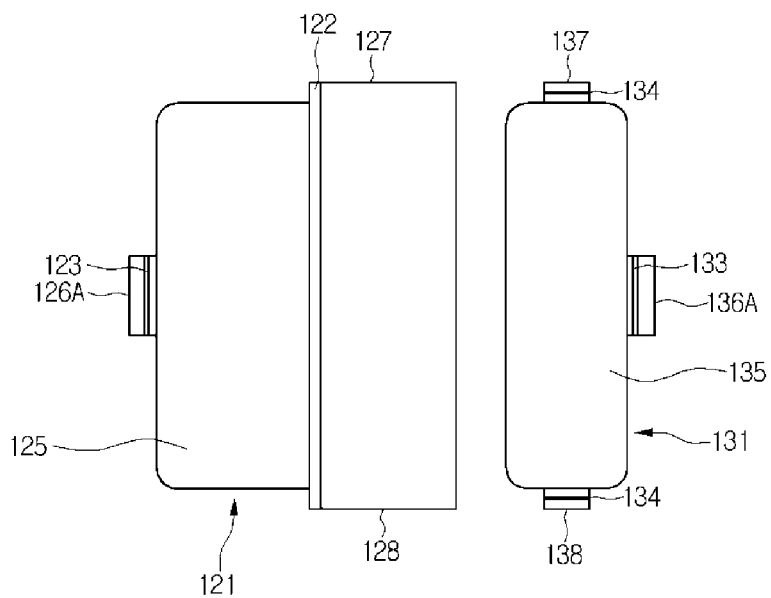

FIGS. 13 and 14 show other examples of FIGS. 11 and 12, and show first and fourth protrusions 126A and 136A of the first and second lead frames 131 disposed in a single form. One protrusion or a plurality of protrusions protrude from the first and second lead frames 131, but the embodiment is not limited thereto.

Figure 15:
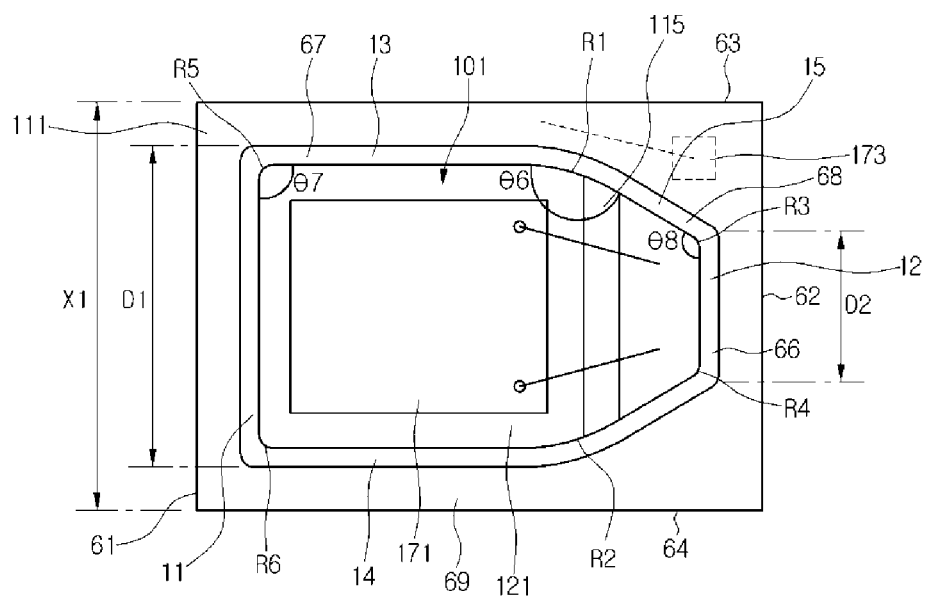
FIG. 15 is a plan view showing a light emitting device according to the second embodiment.

FIG. 15 is a plan view showing a light emitting device according to the embodiment. In the following description of the second embodiment, the same parts as those of the first embodiment will make a reference to the first embodiment.

Referring to FIG. 15, the light emitting device includes the body 111 having the cavity 111, a plurality of lead frames 121 and 131, a light emitting chip 171, a wire 175, and a molding member.

In the first to sixth inner surfaces 11 to 16 of the cavity 101, at least one of corners between adjacent inner surfaces may be curved with a predetermined curvature. For example, the corners between the first and third inner surfaces 11 and 13 and the first and fourth inner surfaces 11 and 14 have curved surface R5 and R6 with a predetermined curvature. The internal angle $\theta 7$ between the first and third inner surfaces 11 and 13, or between the first and fourth inner surfaces 11 and 14 may be in the range of 88° to 92°. The curvatures of the curved surfaces R5 and R6 may be in the range of 0.05±0.01 mm. The curvatures may have the same value.

The corners between the third inner surface 13 and the fifth inner surface 15 of the cavity 101 and between the fourth inner surface 14 and the sixth inner surface 16 include curved surfaces R1 and R2 with a predetermined curvature. The internal angle $\theta 6$ between virtual line segments extending from the third and fifth inner surfaces 13 and 15 or between virtual line segments extending from the fourth and sixth inner surfaces 14 and 16 may be in the range of 120° to 165°. The curvatures of the curved surfaces R1 and R2 may be in the range of 0.80±0.08 mm, and may be equal to each other.

The corners between the second inner surface 12 and the fifth inner surface 15 of the cavity 101 and between the second inner surface 12 and the sixth inner surface 16 include curved surfaces R3 and R4 with a predetermined curvature. The internal angle $\theta 8$ between virtual line segments extending from the second and fifth inner surfaces 12 and 15 or between virtual line segments extending from the second and sixth inner surfaces 12 and 16 may be in the range of 110° to 160°. The curvatures of the curved surfaces R3 and R4 may be less than the curvatures of the curved surfaces R1 and R2, and greater than the curvatures of the curved surface R5 and R6.

The inflection point between the third and fifth inner surfaces 13 and 15 of the cavity 101 and the inflection point between the fourth and sixth inner surface surfaces 14 and 16 of the cavity 101 may be formed on the first lead frame 121 adjacent to the gap part 115.

In this case, the curved surfaces R1 to R6 may represent the contour line making contact with the bottom surface of the cavity 101, may be central portions of the corners, or may represent the contour line making contact with the top surface of the body 111.

Figure 16:
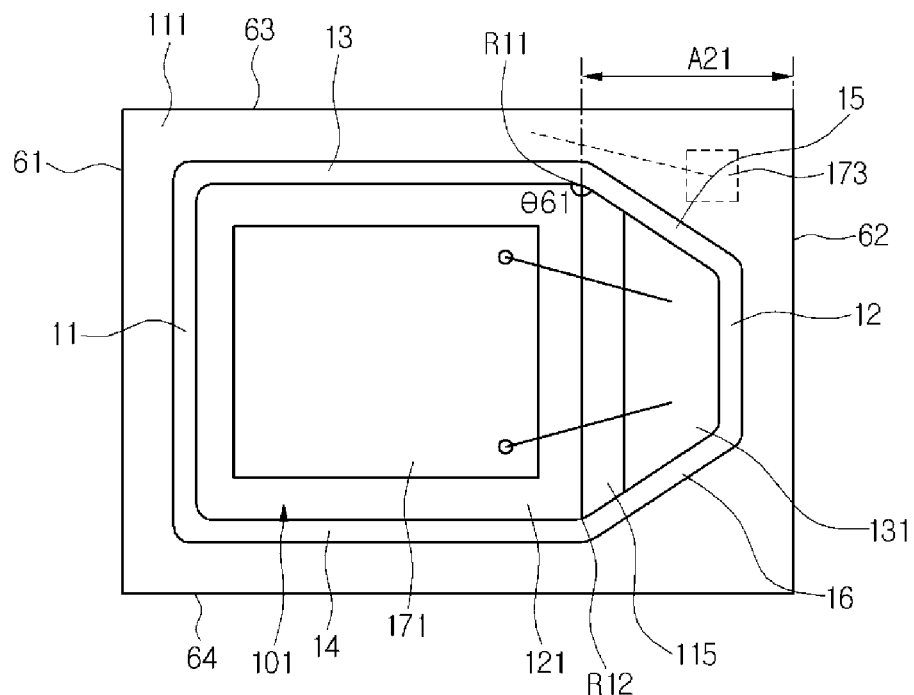
FIG. 16 is a plan view showing the modification of the light emitting device of FIG. 15.

FIG. 16 is a plan view showing the modification of the light emitting device of FIG. 15. In the following description referring to FIG. 16, the same parts as those of the first second embodiments will make a reference to the first and second embodiments.

Referring to FIG. 16, in the light emitting device, the corners between the third and fifth inner surfaces 13 and 15 of the cavity 101 and the corners between the fourth and sixth inner surfaces 14 and 16 of the cavity 101 serve as inflection points R11 and R12, respectively, or may be curved or angulated. The internal angles $\theta 61$ between the third and fifth inner surfaces 13 and 15 of the cavity 101, and between the fourth inner surfaces 14 and the sixth inner surfaces 16 of the cavity 101 may be in the range of 120° to 165°.

The inflection points between the third and fifth inner surfaces 13 and 15 of the cavity 101 and between the fourth and sixth inner surfaces 14 and 16 may be formed in the contact regions of the first lead frame 121 and the gap part 115.

Figure 17:
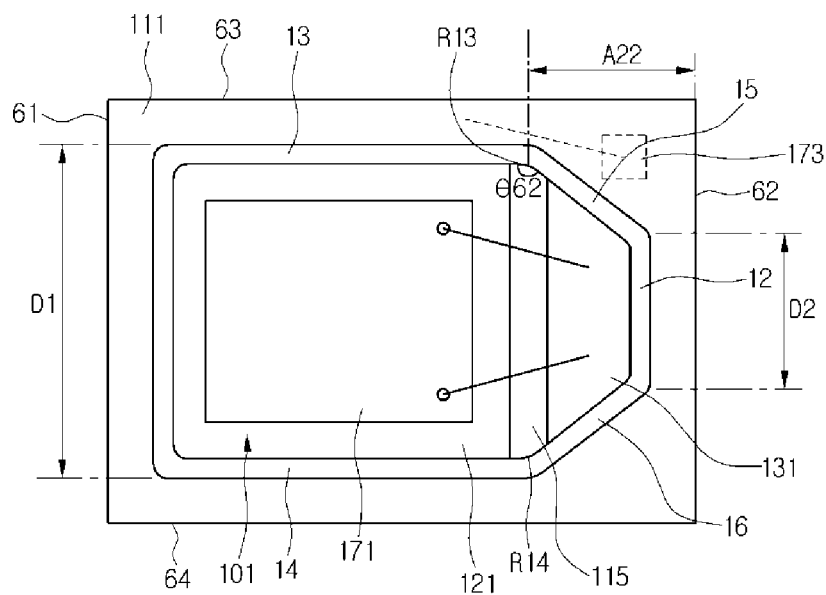
FIG. 17 is a plan view showing the modification of the light emitting device of FIG. 15.

FIG. 17 is a plan view showing the modification of the light emitting device of FIG. 15. In the following description referring to FIG. 17, the same parts as those of the first second embodiments will make a reference to the first and second embodiments.

Referring to FIG. 17, in the light emitting device, the corners between the third and fifth inner surfaces 13 and 15 of the cavity 101 and the corners between the fourth and sixth inner surfaces 14 and 16 of the cavity 101 serve as inflection points R13 and R14, respectively, or may be curved or angulated. The internal angles $\theta 62$ between the third and fifth inner surfaces 13 and 15 of the cavity 101, and between the fourth inner surfaces 14 and the sixth inner surfaces 16 of the cavity may be in the range of 120° to 165°.

The inflection point R13 between the third and fifth inner surfaces 13 and 15 of the cavity 101, and the inflection point R14 between the fourth and sixth inner surfaces 14 and 16 may be disposed between the gap part 115 between the first and second lead frames 121 and 131. The inflection points R13 and R14 are spaced apart from a horizontal line segment to the second lateral side part 12 of the body 111 by a predetermined distance A22, and the distance A22 may be longer than that of the second lead frame 131. Alternatively, the inflection points R13 and R14 are disposed on the second lead frame 131 adjacent to the gap part 115, or may be formed at the boundary part between the gap part 115 and the second lead frame 131.

As shown in FIGS. 16 and 17, according to the embodiment, the inner surfaces 15 and 16 connected between the second inner surface 12 of the cavity 101 and the third and fourth inner surfaces 13 and 14 may be disposed in the form of one or plural flat surfaces or curved surfaces, and may partially have straight line sections.

Figure 18:
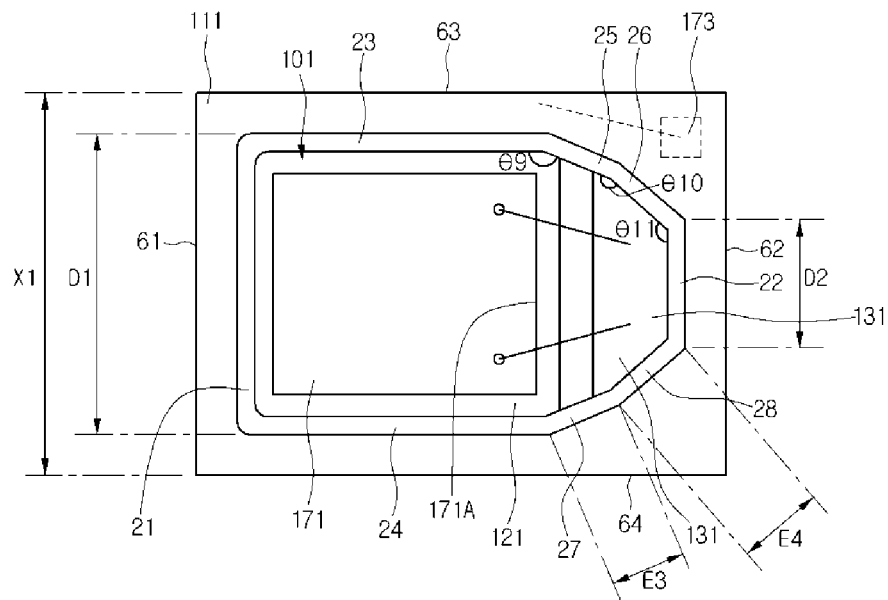
FIG. 18 is a plan view showing a light emitting device according to the third embodiment.

FIG. 18 is a plan view showing a light emitting device according to the third embodiment. In the following description of the third embodiment, the same parts as those of the first embodiment will make a reference to the first embodiment.

Referring to FIG. 18, in the light emitting device, inner surfaces 15A and 16A connecting the second inner surface 12 of the cavity 101 and the third and fourth inner surfaces 13 and 14 may include only curved surfaces R15 and R16 having a predetermined curvature without straight line sections.

Figure 19:
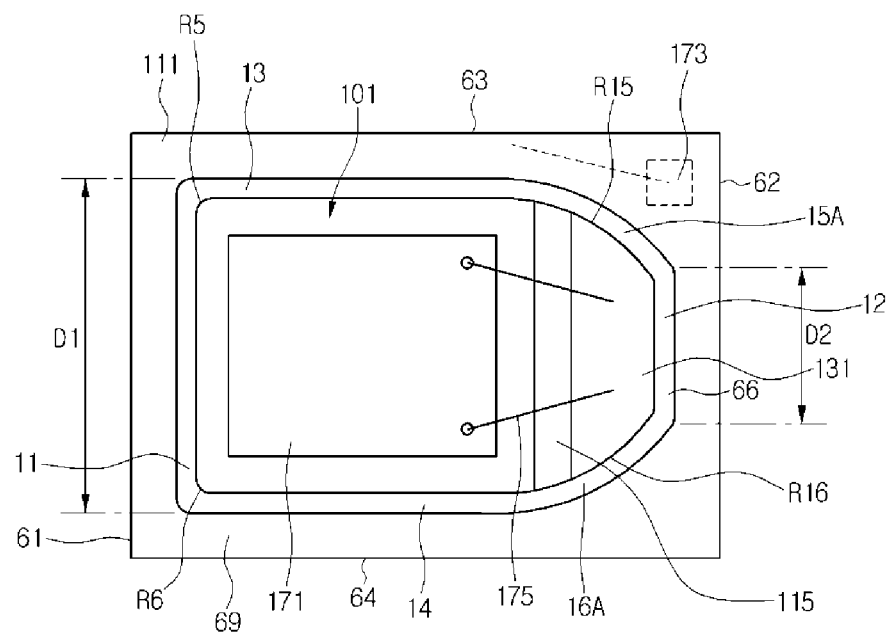
FIG. 19 is a plan view showing a light emitting device according to the fourth embodiment.

FIG. 19 is a plan view showing a light emitting device according to the fourth embodiment. In the following description of the fourth embodiment, the same parts as those of the first embodiment will make a reference to the first embodiment.

Referring to FIG. 19, the light emitting device includes a plurality of inner surfaces 21 to 28 at the cavity 101 of the body 111, and at least two inner surfaces among the inner surfaces 21 to 28 correspond to one lateral side 171A of the light emitting chip 171.

The inner surfaces 21 to 28 of the cavity 101 include the first and second inner surfaces 21 and 22 disposed in opposition to each other, the third and fourth inner surfaces 23 and 24 adjacent to the first inner surface 21 while being disposed in opposition to each other, and the fifth and sixth inner surfaces 25 and 26 having the multi-bending structure between the third and second inner surfaces 23 and 22, and the seventh and eight inner surfaces 27 and 28 having the multi-bending structure between the fourth and second inner surfaces 24 and 22.

The bending angles θ9, θ10, and θ11 from the third inner surface 23 to the fourth inner surface 24 to the second inner surface 22 may be equal to each other or different from each other. Each of the bending angles θ9, θ10, and θ11 may be in the range of 100° to 170°.

In addition, the lengths E3 and E4 of the fifth inner surface 25 or the seventh inner surface 24 and the sixth inner surface 26 or the eighth inner surface 28 may be equal to each other or different from each other. The length E4 of the seven inner surface 27 or the eighth inner surface 28 may be longer than the length E3 of the fifth inner surface 25 or the sixth inner surface 26, but the embodiment is not limited thereto. In addition, the corners between the inner surfaces 21 to 28 of the cavity 101 may have a curved surface or an angular surface, but the embodiment is not limited thereto.

Figure 20:
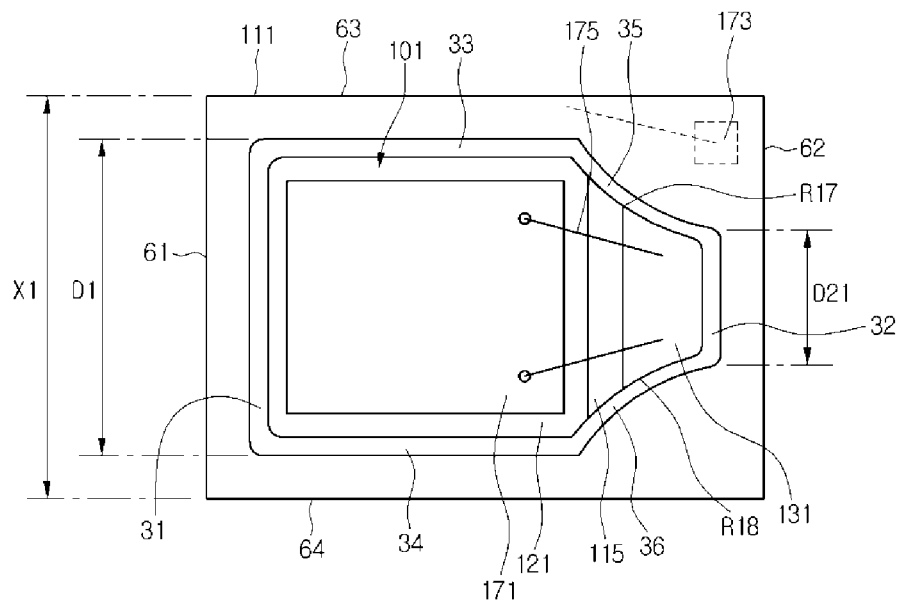
FIG. 20 is a side sectional view showing a light emitting device according to the fifth embodiment.

FIG. 20 is a plan view showing a light emitting device according to the fifth embodiment. In the following description of the fifth embodiment, the same parts as those of the first embodiment will make a reference to the first embodiment.

Referring to FIG. 20, in the light emitting device, at least one inner surface among the inner surfaces 31 to 37 of the cavity 101 of the body 111 has a surface convex toward the central of the cavity 101. For example, the first and second inner surfaces 31 and 32 are disposed in opposition to each other, and the third and fourth inner surfaces 33 and 34 are disposed in opposition to each other. The fifth inner surface 35 having a curved surface 17 convex toward the center of the cavity 101 is disposed between the third and second inner surfaces 33 and 32. The sixth inner surface 35 having a curved surface R18 convex toward the center of the cavity 101 is disposed between the fourth and second inner surfaces 34 and 32. The fifth and sixth inner surfaces 35 and 36 may be inclined with respect to the thickness direction of the body 111, or perpendicular to the thickness direction of the body 111, but the embodiment is not limited thereto.

The fifth and sixth inner surfaces 35 and 35 of the cavity 101 protrude in the convex shape toward the center of the cavity 101, so that the width D21 of the second inner surface 32 of the cavity 101 may be longer than that of the first embodiment. Therefore, the space in which the protective chip 173 may be mounted can be effectively ensured. The interval between the fifth and sixth inner surfaces 35 and 36 is gradually reduced, so that the light emitted from the light emitting chip 171 can be effectively reflected.

FIG. 20 is a plan view showing a light emitting device according to the fifth embodiment. The structure of the cavity 101 of the light emitting device shown in FIG. 21 may include one of the structures of the first to fourth embodiments, and the same parts will make reference to the description of the structure according to the embodiment.

Figure 21:
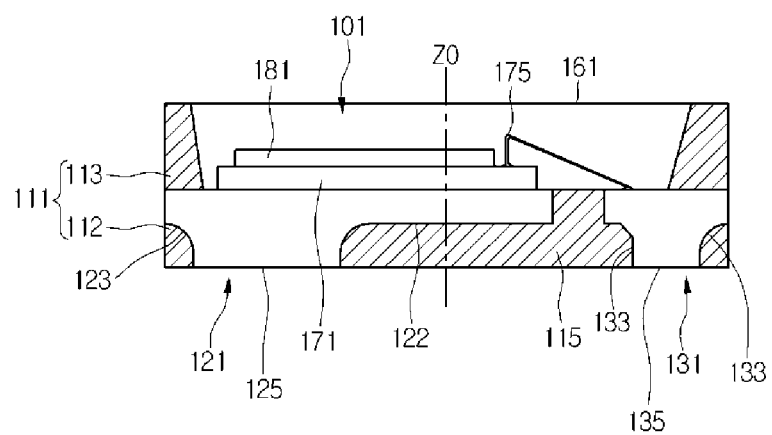
FIG. 21 is a side sectional view showing a light emitting device according to the sixth embodiment.

Referring to FIG. 21, a phosphor substance layer 181 is disposed on the light emitting chip 171. The molding member 161 may not include a phosphor substance layer, or a phosphor substance different from the phosphor substance contained in the phosphor substance layer 181.

The phosphor substance layer 181 may have an area smaller than the area of the top surface of the light emitting chip 171. The phosphor substance layer 181 may be formed on the top surface and the lateral side of the light emitting chip 171, but the embodiment is no limited thereto. The phosphor substance layer 181 may include at least one of blue, red, yellow, and green color phosphor substances.

In addition, in the second lead frame 131, the fourth recess part 133 may be further formed at a region corresponding to the gap part 115, but the embodiment is not limited thereto. In addition, the center of the light emitting chip 171 may deviate from the central axis Z0 of the light emitting device.

Figure 22:
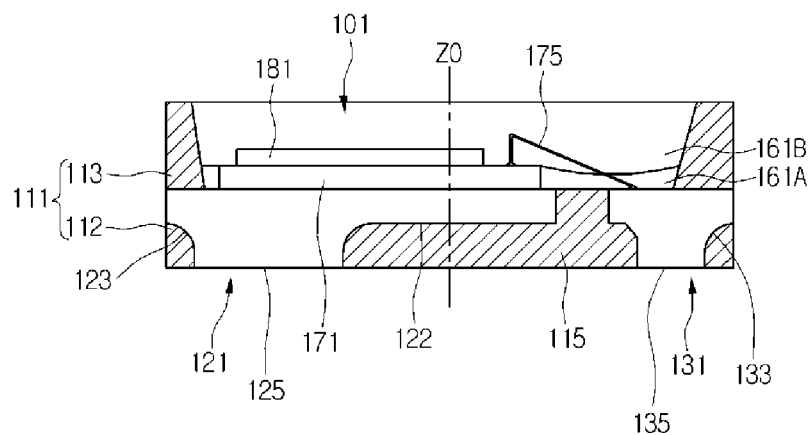
FIG. 22 is a side sectional view showing a light emitting device according to the seventh embodiment.

FIG. 22 is a plan view showing a light emitting device according to the sixth embodiment. The structure of the cavity 101 of the light emitting device shown in FIG. 22 may include one of the structures of the first to fourth embodiments, and the same parts will make reference to the description of the structure according to the embodiment.

Referring to FIG. 22, in the light emitting device, the light emitting chip 171 is disposed on at least one of the first and second lead frames 121 and 131, and the light emitting chip 171 is disposed in the cavity 101.

The cavity 101 includes a first molding member 161A having a height lower than that of the top surface of the light emitting chip 171, and a second molding member 161B disposed on the light emitting chip 171 and the first molding member 161A. The first and second molding members 161A and 161B may include metallic oxides. For example, the metallic oxides of the first and second molding members 161A and 161B may be identical to each other or different from each other.

The first molding member 161A includes the first metallic oxide, and the second molding member 161B includes a second metallic oxide. The first metallic oxide includes one of $SiO_2$, $SiO_x$, $SiO_xN_y$, $Si_3N_4$, $Al_2O_3$, and $TiO_2$, and the second metallic oxide includes one of $SiO_2$, $SiO_x$, $SiO_xN_y$, $Si_3N_4$, $Al_2O_3$, and $TiO_2$.

In addition, 7.5 wt % to 12.5 wt % of the first metallic oxide may be contained in the first molding member 161A. Accordingly, the first molding member 161A acts as a reflective layer disposed around the light emitting chip 171. The first molding member 161A acts as the reflective layer to compensate for the irregular distribution of the orientation angles of light emitted from the cavity 101 having the asymmetric structure disclosed in the embodiment.

Figure 27:
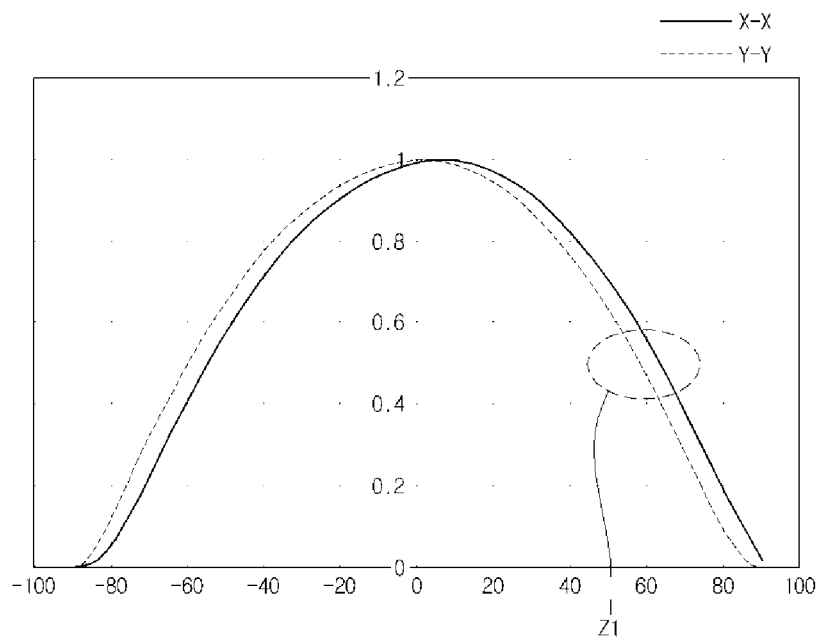
FIGS. 27 to 28 are graphs the comparison in the distribution of the orientation angle of the light emitting device according to the embodiment.
Figure 28:
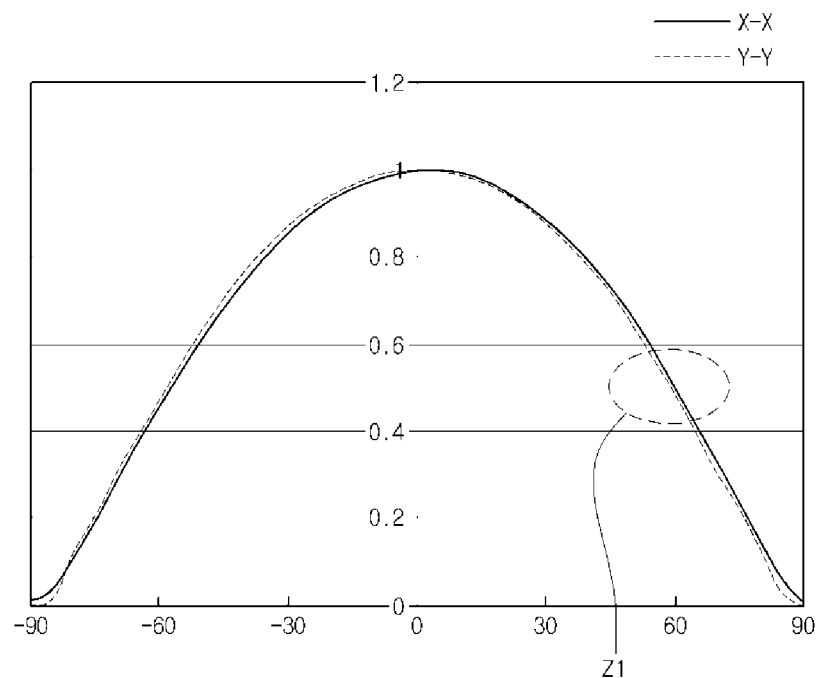

In addition, 7.5 wt % to 12.5 wt % of the first metallic oxide may be contained in the second molding member 161B. Accordingly, the second molding member 161B may act as a diffusion layer on the light emitting chip 171. FIG. 27 is a graph showing the distribution of orientation angles when the first molding member 16A representing reflectance is not disposed in the cavity of the light emitting device, and FIG. 28 is a graph showing the distribution of orientation angles when the first molding member 16A representing reflectance is disposed in the cavity of the light emitting device. As shown in the comparison between FIGS. 27 and 28, the difference in the orientation angles between the first axis Y-Y of FIG. 1 and the second axis X-X of FIG. 1 at the side region Z1 may be reduced 2° or less.

Although not shown in drawings, the phosphor substance layer is interposed between the light emitting chip 171 and the second molding member 161B as shown in FIG. 21, or the phosphor substance may be contained in the second molding member.

Figure 23:
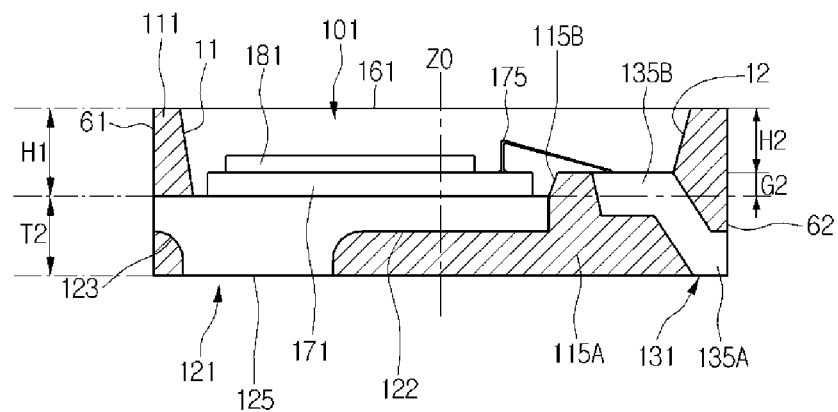
FIG. 23 is a side sectional view showing a light emitting device according to the eighth embodiment.

FIG. 23 is a side sectional view showing the light emitting device according to the seventh embodiment. The structure of the cavity 101 in the light emitting device of FIG. 23 may include one of structures according to the first to fourth embodiments, and the same parts will make reference to that of the embodiment.

Referring to FIG. 23, in the light emitting device, the bottom surface of the cavity 101 in the body 111 may be a flat surface classified into a region disposed therein with the light emitting chip 171 and a region without the light emitting chip 171. For example, the top surface of the first lead frame 121 having the light emitting chip 171 mounted thereon is not aligned in line with the top surface of the second lead frame 131 separated from the light emitting chip 171. According to the embodiment, the top surface of the second lead frame 131 is disposed higher than the top surface of the first lead frame 121 by a predetermined difference G2, and the first and second lead frames 121 and 131 are supported by using the gap part 115 between the first and second lead frames 121 and 131.

The height difference G2 between the top surface of the second lead frame 131 and the top surface of the first lead frame 121 is 50% or less of the thickness T2 of the first lead frame 121, for example, 10% to 50% of the thickness T2 of the first lead frame 121.

The second lead frame 131 includes a bonding part 125B disposed on the bottom surface of the cavity and a lead region 135A disposed on the bottom surface of the body. The lead region 135A may be disposed so that the lead region 135A may be bent from the bonding part 125B.

The gap part 115A between the first and second lead frames 121 and 131 has an inclined surface 115B corresponding to the light emitting chip 171. The inclined surface 115B can effectively reflect the light emitted from the light emitting chip 171. The height H2 of the cavity 101 at the second inner surface 12 may be lower than the height H1 of the cavity 101 in the first inner surface 11. The phosphor substance layer 181 may be disposed on the light emitting chip 171.

The phosphor substance layer 181 may be disposed on the top surface of the light emitting chip 171 or the top and lateral surfaces of the light emitting chip 171, but the embodiment is not limited thereto.

Figure 24:
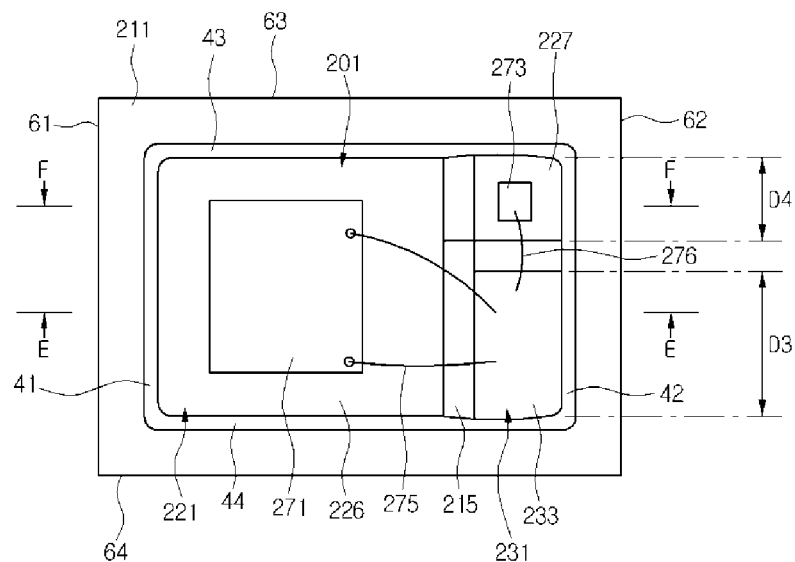
FIGS. 24 to 26 are views showing the light emitting device according to the ninth embodiment.
Figure 25:
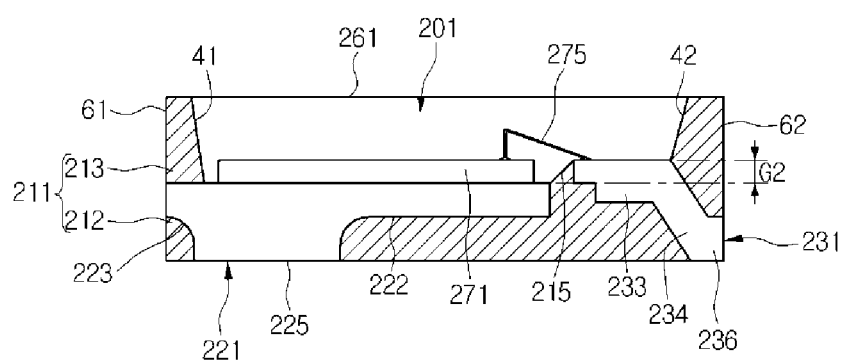
Figure 26:
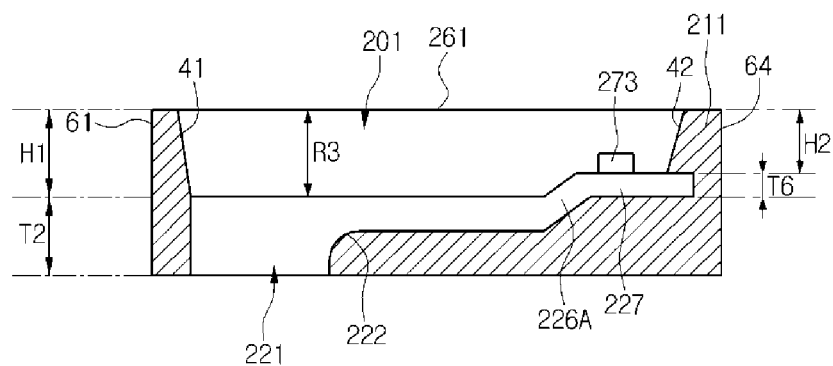

FIGS. 24 to 26 are views showing the light emitting device according to the eighth embodiment. FIG. 24 is a plan view showing the light emitting device, and FIG. 25 is a sectional view taken along lien E-E of the light emitting device of FIG. 24. FIG. 26 is a sectional view taken along line F-F of the light emitting device of FIG. 24. In the following description of the eighth embodiment, the same components as those of the above embodiment will make reference to the embodiments.

Referring to FIGS. 24 to 26, the light emitting device 200 includes a body 211 having a cavity 201, a plurality of lead frames 221 and 231, a light emitting chip 271, a wire 275, and a molding member 261.

The body 211 includes the first to fourth lateral side parts 61 to 64 serving as outer surfaces, and the cavity 201 of the body 211 includes a plurality of inner surfaces 41, 42, 43, and 44. The corners between the inner surfaces 41 to 44 are curved or angulated, but the embodiment is not limited thereto.

The body 211 includes a support body 212 coupled with the first and second lead frames 221 and 231, and a reflection body 213 disposed on the first and second lead frames 221 and 231.

The first lead frame 211 extends to the lower portions of the first and second inner surfaces 41 to 44 of the cavity 201, and the second lead frame 331 extends to the lower portions of the second and fourth inner surfaces 42 and 44.

The first lead frame 211 includes first and second recess parts 222 and 223 forming the step structure from the first lead region 225 which is disposed at the lower portion of the first lead frame 211. The description of the structures of the first lead region 225 and the first and second recess parts 222 and 223 will make reference to the description of the first embodiment.

The first lead frame 211 includes a first bonding part 226 having the light emitting chip disposed therein and a second bonding part 227 extending to the lower portion of the second inner surface 32 of the cavity 201. The protective chip 272 is disposed on the second bonding part 227.

The second bonding part 227 has a step structure from the first bonding part 226. Regarding the depth of the cavity 201, the height H2 of the cavity 201 on the top surface of the second bonding part 227 may be lower than the depth H1 of the cavity 201 on the top surface of the first bonding part 226.

As shown in FIG. 26, the thickness T6 of the second bonding part 227 may be 50% or more of the thickness T2 of the first lead frame 221.

The second lead frame 231 includes a third bonding part 233 disposed on the bottom surface of the cavity 201, a second lead region 236 exposed to the bottom surface of the body 211, and a connection part 234 connecting the third bonding part 233 to the second lead region 236. The width D3 of the third bonding part 233 may be wider than the width D4 of the second bonding part 227.

As shown in FIG. 25, the gap part 215 is interposed between the first and second lead frames 221 and 231, and a portion of the gap part 215 may protrude beyond the first bonding part 226. Accordingly, the gap part 215 has an inclined surface 215A with respect to one lateral side of the light emitting chip 271 to reflect the light incident from the light emitting chip 271.

As shown in FIG. 26, the bending surface 226A between the first and second bonding parts 226 and 227 is inclined, and corresponds to the lateral side of the light emitting chip 271.

The light emitting chip 271 is connected to the third bonding part 233 of the second lead frame 231 through the wire 275. The protective chip 273 may be connected to the third bonding part 233 of the second lead frame 231 through the wire 276.

Figure 29:
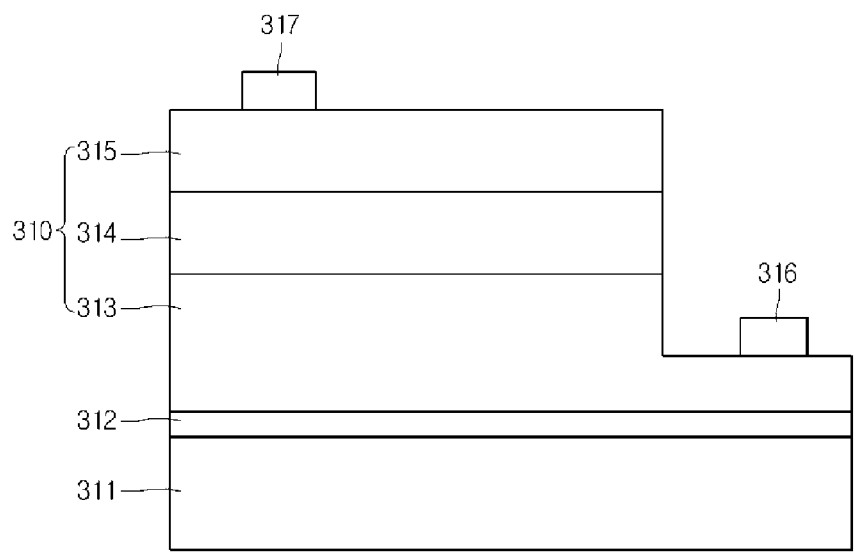
FIG. 29 is a sectional view showing one example of a light emitting chip in a light emitting device according to the embodiment.
Figure 30:
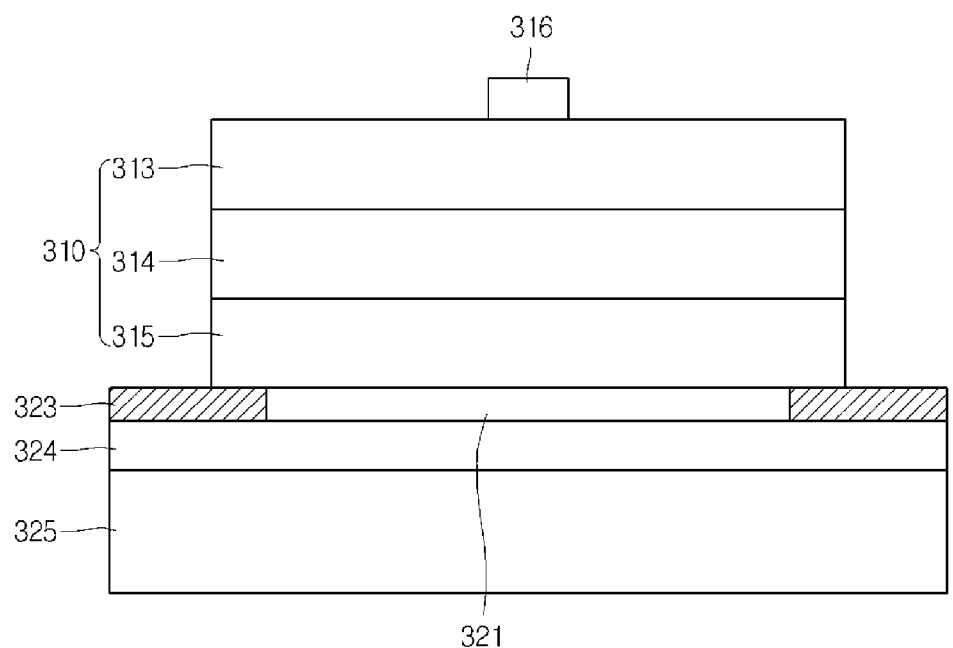
FIG. 30 is a sectional view showing another example of a light emitting chip in a light emitting device according to the embodiment.

FIG. 29 is a side sectional view showing one example of the light emitting chip according to the embodiment.

Referring to FIG. 29, the light emitting chip includes a substrate 311, a buffer layer 312, a light emitting structure 310, a first electrode 316, and a second electrode 317. The substrate 311 may include a substrate including a transmissive material or a non-transmissive material, and may include a conductive substrate or an insulating substrate.

The buffer layer 312 reduces the lattice constant difference between the materials constituting the substrate 311 and the light emitting structure 310, and may include a nitride semiconductor. A nitride semiconductor layer, which is not doped with dopants, is further disposed between the buffer layer 312 and the light emitting structure 310, so that the crystal quality can be improved.

The light emitting structure 310 includes a first conductive semiconductor layer 313, an active layer 314, and a second conductive semiconductor layer 315.

The first conductive semiconductor layer 313 may include the group III-V compound semiconductor doped with the first conductive dopant. For example, the first conductive semiconductor layer 313 may include the semiconductor material having the compositional formula of $In_xAl_yGa_{1-x-y}N$ ($0 \leq x \leq 1$, $0 \leq y \leq 1$, $0 \leq x+y \leq 1$). In detail, the first conductive semiconductor layer 313 may include the stack structure of layers including one selected from the group consisting of GaN, InN, AlN, InGaN, AlGaN, InAlGaN, AlInN, AlGaAs, GaP, GaAs, GaAsP, and AlGaInP. If the first conductive semiconductor layer 313 is an n type semiconductor layer, the first conductive dopant includes the n type dopant such as Si, Ge, Sn, Se, or Te.

A first clad layer may be formed between the first conductive semiconductor layer 313 and the active layer 314. The first clad layer may include a GaN-based semiconductor, and the bandgap of the first clad layer may be equal to or greater than the bandgap of the active layer 314. The first clad layer has the first conductive type, and confines carriers.

The active layer 314 is disposed on the first conductive semiconductor layer 313, and includes a single quantum well structure, a multiple quantum well (MQW) structure, a quantum wire structure or a quantum dot structure. The active layer 314 has the cycle of the well and barrier layers. The well layer may have the composition formula of $In_xAl_yGa_{1-x-y}N$ ($0 \leq x \leq 1$, $0 \leq y \leq 1$, $0 \leq x+y \leq 1$), and the barrier layer may have the composition formula of $In_xAl_yGa_{1-x-y}N$ ($0 \leq x \leq 1$, $0 \leq y \leq 1$, $0 \leq x+y \leq 1$). At least one cycle of the well/barrier layers may be used through the stack structure of InGaN/GaN, GaN/AlGaN, InGaN/AlGaN, InGaN/InGaN, InAlGaN/AlGaN and InAlGaN/InAlGaN. The barrier layer may include a semiconductor material having the bandgap higher than the bandgap of the well layer.

The second conductive layer 315 is formed on the active layer 314. The second conductive layer 315 includes a semiconductor doped with second conductive dopants, for example, includes a semiconductor having the composition formula of $In_xAl_yGa_{1-x-y}N$ ($0 \leq x \leq 1$, $0 \leq y \leq 1$, $0 \leq x+y \leq 1$). In detail, the second conductive semiconductor layer 315 may include one selected from compound semiconductors such as GaN, InN, AlN, InGaN, AlGaN, InAlGaN, AlInN, AlGaAs, GaP, GaAs, GaAsP, and AlGaInP. If the second conductive semiconductor layer 315 is a p type semiconductor layer, the semiconductor conductive dopant includes the p type dopant such as Mg, Zn, Ca, Sr, or Ba.

The second conductive semiconductor layer 315 may include a superlattice structure, and the superlattice structure may include an InGaN/GaN superlattice structure or am AlGaN/GaN superlattice structure. The superlattice structure of the second conductive semiconductor layer 315 abnormally spreads the current, thereby protecting the active layer 314.

In addition, the light emitting structure 310 may have an opposite conductive type. For example, the first conductive semiconductor layer 313 may include a P type semiconductor layer, and the second conductive semiconductor layer 315 may include an N type semiconductor layer. The second conductive semiconductor layer 315 may be disposed thereon with a first conductive semiconductor layer having the polarity opposite to the second conductive type polarity.

The light emitting structure 310 may be realized by using one of an n-p junction structure, a p-n junction structure, an n-p-n junction structure, and a p-n-p junction structure. The "p" represents a p type semiconductor, the "n" represents an n type semiconductor layer, and the "-" represents that the p type semiconductor is directly or indirectly connected to the n type semiconductor. Hereinafter, a case that the uppermost layer of the light emitting structure 310 is the second conductive semiconductor layer 315 will be described for the convenience of explanation.

The first electrode 316 is disposed on the first conductive semiconductor layer 313, and the second electrode 317 having a current spreading layer is disposed on the second conductive semiconductor layer 315. The first and second electrodes 316 and 317 are connected to each other through a wire, or through another connection scheme.

FIG. 28 is a graph showing another example of the light emitting chip according to the embodiment. Hereinafter, in the following description of the embodiment, the details of the same parts as that of FIG. 27 will be omitted except for brief description.

Referring to FIG. 28, in a light emitting chip according to the embodiment, a contact layer 321 is formed under a light emitting structure 310, a reflective layer 324 is formed under the contact layer 321, a support member 325 is formed under the reflective layer 324, and a protective layer 323 may be formed around the reflective layer 324 and the light emitting structure 310.

One or a plurality of first electrodes 316 may be formed on the light emitting structure 310, and the first electrode 316 includes a pad bonded to a wire.

The light emitting chip may be formed by removing a growth substrate after forming a contact layer 321, a protective layer 323, a reflective layer 324, and a support member 323 under the second conductive semiconductor layer 315.

The contact layer 321 may make ohmic-contact with a lower layer of the light emitting structure 310, for example, the second conductive semiconductor layer 315, and may include a metallic oxide, a metallic nitride, an insulating material, or a conductive material. For example, the contact layer 321 may include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. The contact layer 321 may be formed in a multi-layer structure by using a metallic material and a transparent material such as IZO, IZTO, IAZO, IGZO, IGTO, AZO, or ATO. For example, the contact layer 321 may have the stack structure of IZO/Ni, AZO/Ag, IZO/Ag/Ni, or AZO/Ag/Ni. A layer to block current may be further formed in the contact layer 321 corresponding to the electrode 316.

The protective layer 323 may include a metallic oxide or an insulating material. For example, the protective layer 323 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, or $TiO_2$. The protective layer 323 may be formed through a sputtering scheme or a deposition scheme. The metal constituting the reflective layer 324 may prevent the layers of the light emitting structure 310 from being shorted.

The reflective layer 324 may include metal such as Ag, Ni, Al, Rh, Pd, Ir, Ru, Mg, Zn, Pt, Au, Hf, or the selective combination thereof. The reflective layer 324 may have a width greater than the width of the light emitting structure 310, thereby improving the light reflection efficiency. A metallic layer for bonding and a metallic layer for thermal diffusion may be further disposed between the reflective layer 324 and the support member 325, but the embodiment is not limited thereto.

The support member 325 serves as a base substrate, and may include metal such as Cu, Au, Ni, Mo, or Cu—W, and a carrier wafer, such as Si, Ge, GaAs, ZnO, and SiC. An adhesive layer may be further formed between the support member 325 and the reflective layer 324, and bonds the two layers to each other. The disclosed light emitting chip is four the illustrative purpose, and the embodiment is not limited thereto. The light emitting chip may be selective applied to the light emitting device according to the embodiment, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 31 and 32, a lighting apparatus shown in FIG. 33, a lighting lamp, a camera flash, a signal lamp, a headlamp for a vehicle, and an electronic display.

Figure 31:
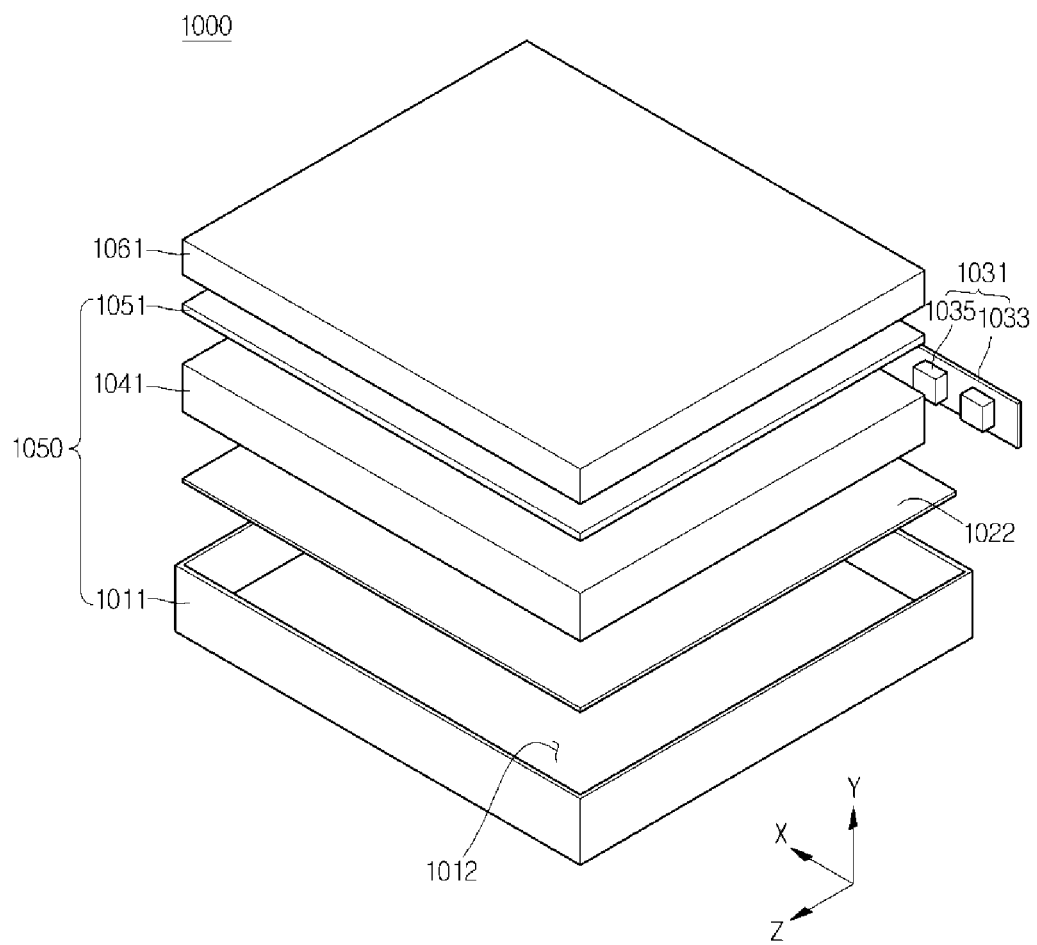
FIG. 31 is a perspective view showing a display apparatus having the light emitting device according to the embodiment.

FIG. 31 is an exploded perspective view showing a display apparatus having the light emitting device according to the embodiment.

Referring to FIG. 31, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light source module 1031 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a substrate 1033 and the light emitting device according to the embodiments or the light emitting device 1035. The light emitting device or the light emitting device 1035 are arranged on the substrate 1033 while being spaced apart from each other at the predetermined interval.

The substrate 1033 may include a printed circuit board (PCB) including a circuit pattern (not shown). In addition, the substrate 1033 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the substrate 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 32:
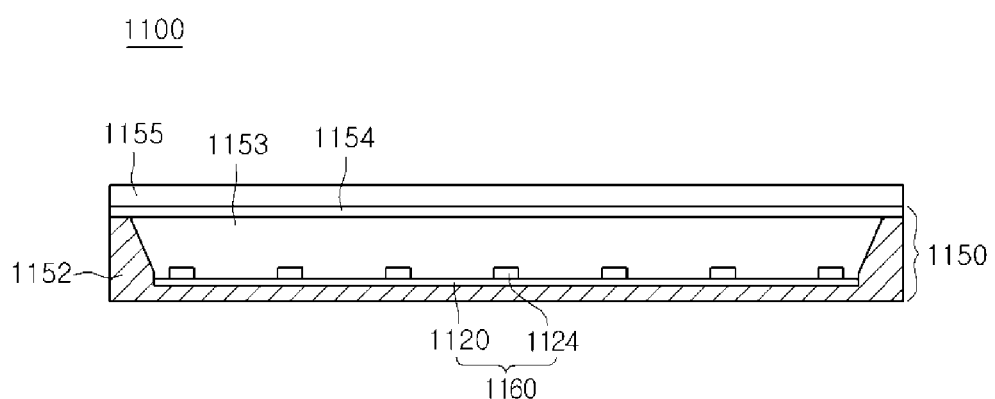
FIG. 32 is a sectional view showing a display apparatus according to the embodiment.

FIG. 32 is a sectional view showing a display apparatus according to the embodiment.

Referring to FIG. 32, the display device 1100 includes a bottom cover 1152, a substrate 1120 on which the light emitting device 1124 are arrayed, an optical member 1154, and a display panel 1155.

The substrate 1120 and the light emitting device 1124 may constitute the light source module 1160. In addition, the bottom cover 1152, at least one light source module 1160, and the optical member 1154 may constitute the light unit. The bottom cover 1151 can be disposed with a receiving section 1153, but the embodiment is not limited thereto. The light source module 1160 includes a substrate 1120, and a plurality of light emitting devices arranged on the substrate 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 33:
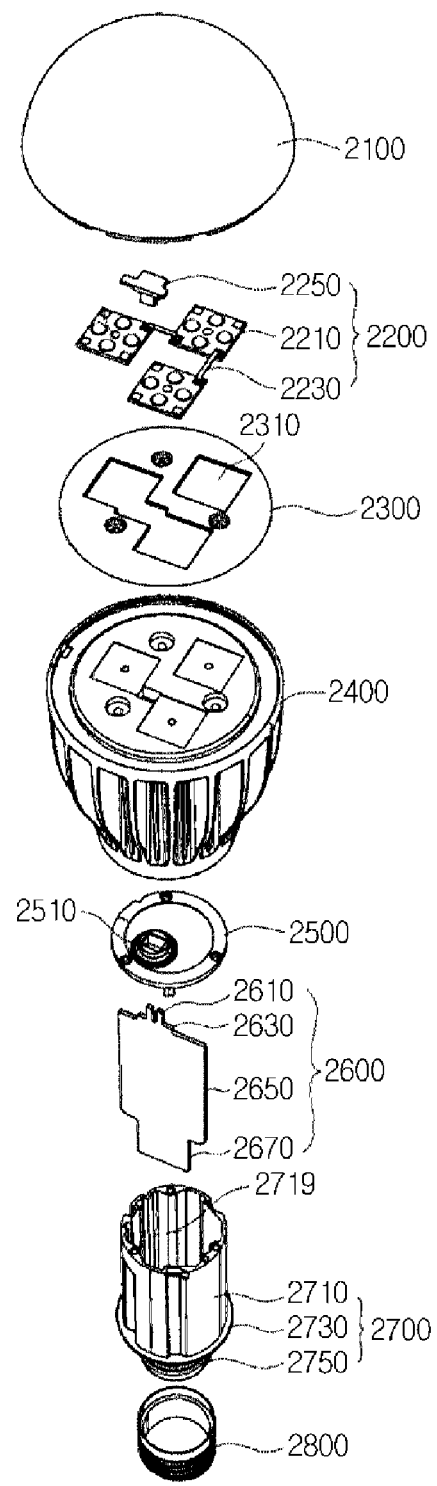
FIG. 33 is an exploded perspective view showing a lighting device having the light emitting device according to the embodiment.

FIG. 33 is an exploded perspective view showing a lighting device having the light emitting device according to the embodiment.

Referring to FIG. 33, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The embodiment can provide a general-purpose light emitting device having lead regions spaced apart from each other so that the light emitting device is mounted on the substrate. The embodiment can provide a light emitting device capable of representing improved heat radiation efficiency. According to the embodiment, the lower region between the lead frames can be effectively supported. The embodiment can provide a cavity of a light emitting device in an asymmetric structure.

According to the embodiment, the interval between inner parts of the cavity of the light emitting device is gradually reduced, so that the distribution of orientation angles can be improved in the cavity having the asymmetric structure. According to the embodiment, the light efficiency in the cavity of the light emitting device can be improved, so that the reliability can be improved. The embodiment can provide the light emitting device capable of reducing light loss caused by the interval between the inner surface of the cavity farther away from the light emitting chip and the light emitting chip if the light emitting chip having a large area is mounted.

The embodiment can reduce the difference between light orientation angles at different axes of the light emitting device. The embodiment can provide a light emitting device having a cavity in the asymmetric structure and used for the general purpose. The embodiment can improve the reliability of the light emitting device and the lighting system having the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a body including first and second lateral side parts corresponding to each other, third and fourth lateral side parts corresponding to each other, and a cavity having an open upper portion;
   a first lead frame disposed on a bottom surface of the cavity while extending in a direction of the first lateral side part of the body;
   a second lead frame disposed on the bottom surface of the cavity while extending in a direction of the second lateral side part of the body;
   a gap part disposed on the bottom surface of the cavity and disposed between the first and second lead frames;
   a light emitting chip disposed on the first lead frame in the cavity; and
   a molding member in the cavity,
   wherein the first lead frame includes a first recess part recessed at a first depth in the direction of the first lateral side part of the body from the gap part and a second recess part recessed at a second depth in a region adjacent to the first lateral side part of the body,
   the first depth of the first recess part is different from the second depth of the second recess part,
   wherein the first recess part is overlapped with the light emitting chip in a vertical direction,
   wherein the first lead frame further includes plurality of first protrusions exposed to the first lateral side part of the body, second protrusion exposed to the third lateral side part of the body, and third protrusion exposed to the fourth lateral side part of the body,
   wherein the first lead frame includes a first region adjacent to the gap part on the first recess part and a second region adjacent to the first lateral side part, the first region has a thickness thinner than a thickness of the second region and is overlapped with the first recess part, and the second and third protrusions protrude from the first region adjacent to the gap part,
   wherein the body includes a reflective insulating material,
   wherein the molding member includes a transmissive resin material,
   wherein the cavity is recessed from a top surface of the body,
   wherein the cavity includes a first inner surface which faces a first lateral side of the light emitting chip, a second inner surface which faces the first inner surface, a third inner surface extended from the first inner surface, a fourth inner surface extended from the first inner surface and which faces the third inner surface, a fifth inner surface disposed between the second and third inner surfaces, and a sixth inner surface disposed between the second and fourth inner surfaces,
   wherein the first, second, third, fourth, fifth and sixth inner surfaces of the cavity contact the molding member,
   wherein the second inner surface has a second width narrower than a first width of the first inner surface,
   wherein the second width is wider than a width of the first lateral side of the light emitting chip,
   wherein a width of the fifth inner surface is smaller than the first width and wider than the second width, and
   wherein an internal angle between the fifth inner surface and the second inner surface is an obtuse angle.

2. The light emitting device of claim 1, wherein the first depth of the first recess part is two times greater than the second depth of the second recess part, or the first depth is in a range of 30% to 60% of a length of the first lead frame.

3. The light emitting device of claim 1, wherein the gap part extends into the first recess part, and a width of a bottom surface of the gap part is two times wider than a width of a top surface of the gap part.

4. The light emitting device of claim 1, wherein the first recess part has a width equal to an interval between the third and fourth lateral side parts of the body, and
   wherein an area of a bottom surface of the first lead frame is narrower than an area of a top surface of the first lead frame by 30% or more of the area of the top surface of the first lead frame.

5. The light emitting device of claim 1, wherein the first lead frame further includes a first lead region interposed between the first and second recess parts and exposed to a bottom surface of the body, and the second lead frame includes a second lead region adjacent to the gap part and exposed to the bottom surface of the body.

6. The light emitting device of claim 5, wherein the second lead frame further includes a third recess part disposed at a region adjacent to the second lateral side part of the body and disposed at a third depth in a direction of the gap part, and the second depth of the second recess part is equal to the third depth of the third recess part.

7. The light emitting device of claim 1, wherein the second lead frame includes plurality of fourth protrusions exposed to the second lateral side part of the body, fifth protrusion exposed to the third lateral side part of the body, and sixth protrusion exposed to the fourth lateral side part of the body, and
   wherein the first protrusions of the first lead frame and the fourth protrusions of the second lead frame are spaced apart from a bottom surface of the body, wherein the second protrusion exposed to the third lateral side part of the body has a width wider than a width of the fifth protrusion exposed to the third lateral side part of the body, wherein the fourth protrusions of the second lead frame are spaced apart from each other and a portion of the body is disposed between the fourth protrusions, and wherein a bottom surface of each of the fourth protrusions is a curved surface and contacts the body.

8. A light emitting device comprising:

a body including first and second lateral side parts corresponding to each other, third and fourth lateral side parts corresponding to each other, and a cavity having an open upper portion;

a first lead frame disposed on a bottom surface of the cavity while extending in a direction of the first lateral side part of the body;

a second lead frame disposed on the bottom surface of the cavity while extending in a direction of the second lateral side part of the body;

a gap part disposed on the bottom surface of the cavity and disposed between the first and second lead frames;

a light emitting chip disposed on the first lead frame in the cavity; and a molding member in the cavity, wherein the first lead frame includes a first recess part recessed at a first depth in the direction of the first lateral side part of the body from the gap part and a second recess part recessed at a second depth in a region adjacent to the first lateral side part of the body, and the first depth of the first recess part is different from the second depth of the second recess part, wherein the body includes a reflective insulating material, wherein the molding member includes a transmissive resin material, wherein the cavity is recessed from a top surface of the body, wherein the cavity includes a first inner surface which faces a first lateral side of the light emitting chip, a second inner surface which faces the first inner surface, a third inner surface extended from the first inner surface, a fourth inner surface extended from the first inner surface and which faces the third inner surface, a fifth inner surface disposed between the second and third inner surfaces, and a sixth inner surface disposed between the second and fourth inner surfaces, wherein the first, second, third, fourth, fifth and sixth inner surfaces of the cavity contact the molding member, wherein the second inner surface has a second width narrower than a first width of the first inner surface, wherein the second width is wider than a width of the first lateral side of the light emitting chip, wherein a width of the fifth inner surface is narrower than the first width and wider than the second width, and wherein an internal angle between the fifth inner surface and the second inner surface is an obtuse angle, wherein the first recess part is overlapped with the light emitting chip in a vertical direction, and wherein the first inner surface and the second inner surface are inclined with respect to a horizontal bottom surface of the body, wherein the first lead frame further includes plurality of first protrusions exposed to the first lateral side part of the body, second protrusion exposed to the third lateral side part of the body, and third protrusion exposed to the fourth lateral side part of the body, and wherein the first lead frame includes a first region adjacent to the gap part on the first recess part and a second region adjacent to the first lateral side part, the first region has a thickness thinner than a thickness of the second region and is overlapped with the first recess part, and the second protrusion and the third protrusion protrude from the first region adjacent to the gap part.

9. The light emitting device of claim 8, wherein the second inner surface of the cavity has a width 2.5 times to 3.5 times narrower than a width of the first inner surface.

10. The light emitting device of claim 8, wherein the second lead frame includes plurality of fourth protrusions exposed to the second lateral side part of the body, fifth protrusion exposed to the third lateral side parts of the body, and sixth protrusion exposed to the fourth lateral side part of the body, and the first protrusions of the first lead frame and the fourth protrusions are spaced apart from a bottom surface of the body, and wherein the second protrusion exposed to the third lateral side part of the body has a width wider than a width of the fifth protrusion exposed to the third lateral side part of the body, wherein the fourth protrusions of the first lead frame are spaced apart from each other and a portion of the body is disposed between the fourth protrusions, and wherein a bottom surface of each of the fourth protrusions is a curved surface and contacts the body.

11. The light emitting device of claim 8, wherein an internal angle between the fifth inner surface and the third inner surface is greater than an internal angle between the fifth inner surface and the second inner surface, and an internal angle between the sixth inner surface and the fourth inner surface is greater than an angle between the sixth inner surface and the second inner surface.

12. A light emitting device comprising:

a body including first and second lateral side parts corresponding to each other, third and fourth lateral side parts corresponding to each other, and a cavity having an open upper portion;

a first lead frame disposed on a bottom surface of the cavity while extending in a direction of the first lateral side part of the body;

a second lead frame disposed on the bottom surface of the cavity while extending in a direction of the second lateral side part of the body;

a gap part disposed on the bottom surface of the cavity and disposed between the first and second lead frames;

a light emitting chip disposed on the first lead frame in the cavity; and a molding member in the cavity, wherein the body includes a reflective insulating material, wherein the molding member includes a transmissive resin material, wherein the cavity is recessed from a top surface of the body, wherein the cavity includes a first inner surface which faces a first lateral side of the light emitting chip, a second inner surface which faces the first inner surface, a third inner surface extended from the first inner surface, a fourth inner surface extended from the first inner surface and which faces the third inner surface, a fifth inner surface disposed between the second and third inner surfaces, and a sixth inner surface disposed between the second and fourth inner surfaces, wherein the second inner surface has a second width narrower than a first width of the first inner surface, wherein the second width is wider than a width of the first lateral side of the light emitting chip, wherein a width of the fifth inner surface is narrower than the first width and wider than the second width, wherein an internal angle between the fifth inner surface and the second inner surface is an obtuse angle, wherein a width of the sixth inner surface is narrower than the first width and wider than the second width, wherein the first, second, third, fourth, fifth and sixth inner surfaces of the cavity contact the molding member, wherein the first recess part is overlapped with the light emitting chip in a vertical direction, wherein a portion of the gap part is disposed in the first recess, and wherein the first lead frame further includes plurality of first protrusions exposed to the first lateral side part of the body, second protrusion exposed to the third lateral side part of the body, and third protrusion exposed to the fourth lateral side part of the body, and wherein the first lead frame includes a first region adjacent to the gap part on the first recess part and a second region adjacent to the first lateral side part, the first region has a thickness thinner than a thickness of the second region and is overlapped with the first recess part, and the second protrusion and third protrusion protrude from the first region adjacent to the gap part, wherein the first protrusions of the first lead frame are spaced apart from each other, wherein bottom surface of each of the first protrusions is a curved surface and contact the body, wherein the second lead frame further includes plurality of fourth protrusions exposed to the second lateral side part of the body, fifth protrusion exposed to the third lateral side part of the body, and sixth protrusion exposed to the fourth lateral side part of the body, wherein the fourth protrusions of the second lead frame are spaced apart from each other, and wherein a bottom surface of each of the fourth protrusions is a curved surface and contact the body.

13. The light emitting device of claim 12, further comprising a protective chip disposed on the second lead frame and disposed between the cavity and at least one of the first to fourth lateral side parts of the body, wherein the second inner surface has a width which is 1.5 times narrower than a width of the first inner surface.

14. The light emitting device of claim 13, wherein the cavity further includes third and fourth inner surfaces connected to the first inner surface and corresponding to each other at both sides of the light emitting chip, a fifth inner surface between the second and third inner surfaces, and a sixth inner surface between the second and fourth inner surfaces, and the protective chip is adjacent to at least one of the fifth and sixth inner surfaces of the cavity.

15. The light emitting device of claim 1, wherein the first protrusions are spaced apart from each other and a portion of the body is disposed between the first protrusions, and wherein bottom surfaces of the first protrusions are curved surfaces and contact the body.

16. The light emitting device of claim 1, wherein a width of the sixth inner surface is narrower than the first width and wider than the second width and an internal angle between the fifth inner surface and the second inner surface is an obtuse angle.

* * * * *